(12) United States Patent
Hakkarainen et al.

(10) Patent No.: US 7,453,136 B2
(45) Date of Patent: Nov. 18, 2008

(54) METHODS, SYSTEMS, AND APPARATUS FOR INTEGRATED CIRCUIT CAPACITORS IN CAPACITOR ARRAYS

(75) Inventors: Juha Mikko Hakkarainen, Palm Beach, FL (US); Juha Seppo Nurminen, North Palm Beach, FL (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 42 days.

(21) Appl. No.: 11/588,530

(22) Filed: Oct. 27, 2006

(65) Prior Publication Data

US 2007/0046519 A1 Mar. 1, 2007

Related U.S. Application Data

(62) Division of application No. 10/624,794, filed on Jul. 22, 2003, now Pat. No. 7,161,516.

(51) Int. Cl.
*H01L 23/00* (2006.01)

(52) U.S. Cl. .............................. 257/532; 257/E27.116

(58) Field of Classification Search ................. 257/532; 438/396; 716/10
See application file for complete search history.

(56) References Cited

U.S. PATENT DOCUMENTS

| | | | | |
|---|---|---|---|---|
| 5,322,438 | A | * | 6/1994 | McNutt et al. ................. 716/8 |
| 5,635,421 | A | * | 6/1997 | Ting ........................... 438/396 |
| 5,952,952 | A | | 9/1999 | Choi et al. |
| 5,973,633 | A | | 10/1999 | Hester |
| 6,016,019 | A | | 1/2000 | Wojewoda |
| 6,496,131 | B2 | | 12/2002 | Yoshinaga |
| 2003/0210165 | A1 | | 11/2003 | Carreau et al. |
| 2004/0129966 | A1 | | 7/2004 | Giuroiu et al. |

OTHER PUBLICATIONS

Behzad Razavi, *Design of Analog CMOS Integrated Circuits*, pp. 619-627, 637-462 and 650-653, McGraw-Hill Higher Education, ISBM 0071188150, 2001.

Iuri Mehr & Larry Singer, *A 55-mW, 10-bit, 40-Msample/s Nyquist-Rate CMOS ADC*, pp. 318-325, IEEE Journal of Solid-State Circuits, vol. 35 No. 3, Mar. 2002.

*Lessons in Electrical Circuits*, vol. IV (Digital), Chapter 13, http://www.ibiblio.org/obp/elecrticalcircuits/digital/digi_13.html, Apr. 2003.

(Continued)

*Primary Examiner*—Evan Pert
(74) *Attorney, Agent, or Firm*—Blakely Sokoloff Taylor & Zafman LLP

(57) ABSTRACT

A capacitor array in an integrated circuit with active unit capacitor cells arranged amongst the dummy unit capacitor cells to provide visual and electrical symmetry. The electrical symmetry provides electrical matching between active unit capacitor cells and the visual symmetry provide process uniformity between the unit capacitor cells. Visual symmetry may be provided by uniform capacitor plate selection and uniform spacing between each. Electrical symmetry is provided by appropriately arranging active unit capacitors amongst dummy unit capacitors in the capacitor array. The capacitor array may be used in an integrated circuit such as for a equally weighted or binary weighted capacitor array or ladder in an analog to digital converter or a digital to analog converter. Methods and rules of layout for arranging the unit capacitors may be manually performed or automatically performed by computer aided design software.

6 Claims, 11 Drawing Sheets

OTHER PUBLICATIONS

B. Razavi & B. Wooley, *A 12-b 5-MSample/s Two-Step CMOS A/D Converter*, IEEE Journal of Solid-State Circuits, pp. 1667-1678, vol. 27 No. 12, Dec. 1992.

Thomas Lee, *The Design of CMOS Radio-Frequency Integrated Circuits*, pp. 37-47, Cambridge University Press, Cambridge, UK, ISBN 0521630614, 1998.

D. Allstot & W. Black, *Technologyical Design Considerations for Monolithic MOS Switched-Capacitor Filtering Systems*, pp. 967-986, Prod. of the IEEE, vol. 71 No. 8, Aug. 1983.

James L. McCreary, *Matching Properties, and Voltage and Temperature Dependence of MOS Capacitors*, pp. 608-606, IEEE Journal of Solid-State Circuits, vol. SC-16, No. 6, Dec. 1981.

Yannis Tsividis & Paolo Antognetti, *Design of MOS VLSI Circuits for Telecommunications*, pp. 20-22, 314-333, Prentice-Hall, New Jersey, ISBN 013200643X01, 1985.

Paul R. Gray & Robert G. Meyer, *Analysis and Design of Analog Integrated Circuits*, Third Edition, pp. 139-140, 167-170, John Wiley & Sons, Inc., ISBN 0471574953, 1993.

Raymond M. Warner & James N. Fordemwalt, *Integrated Circuits Design Principles and Fabrication*, pp. 246-255, 270, McGraw-Hill Book Company, 1965.

Young-Deuk Jeon, Seung-Chul Lee, Sang-Min Yoo, & Seung-Hoon Lee, *Acquisition-Time Minimization and Merged-Capacitor Switching Techniques for Sampling-Rate and Resoulution Improvement of CMOS ADCs*, pp. 451-454, 2000 IEEE International Symposium on Circuits and Systems, May 28-31, Geneva, Switzerland, 2000.

Richard C. Dorf Editor-in-Chief, *The Electrical Engineering*, pp. 15-33, 11321151, CRC Press, Boca Raton, FL, ISBN 0489301858, 1993.

David Halliday & Robert Resnick, *Physics* Part Two Third Edition, 650-674, John Wiley & Sons, ISBN 948012, 1978.

Alan B Grenene, *Bipolar and MOS Analog Integrated Circuit Design*, pp. 712-727, 753-764, 784-791, 825-879, ISBN 0471085294, John Wiley & Sons, Inc., 1984.

* cited by examiner

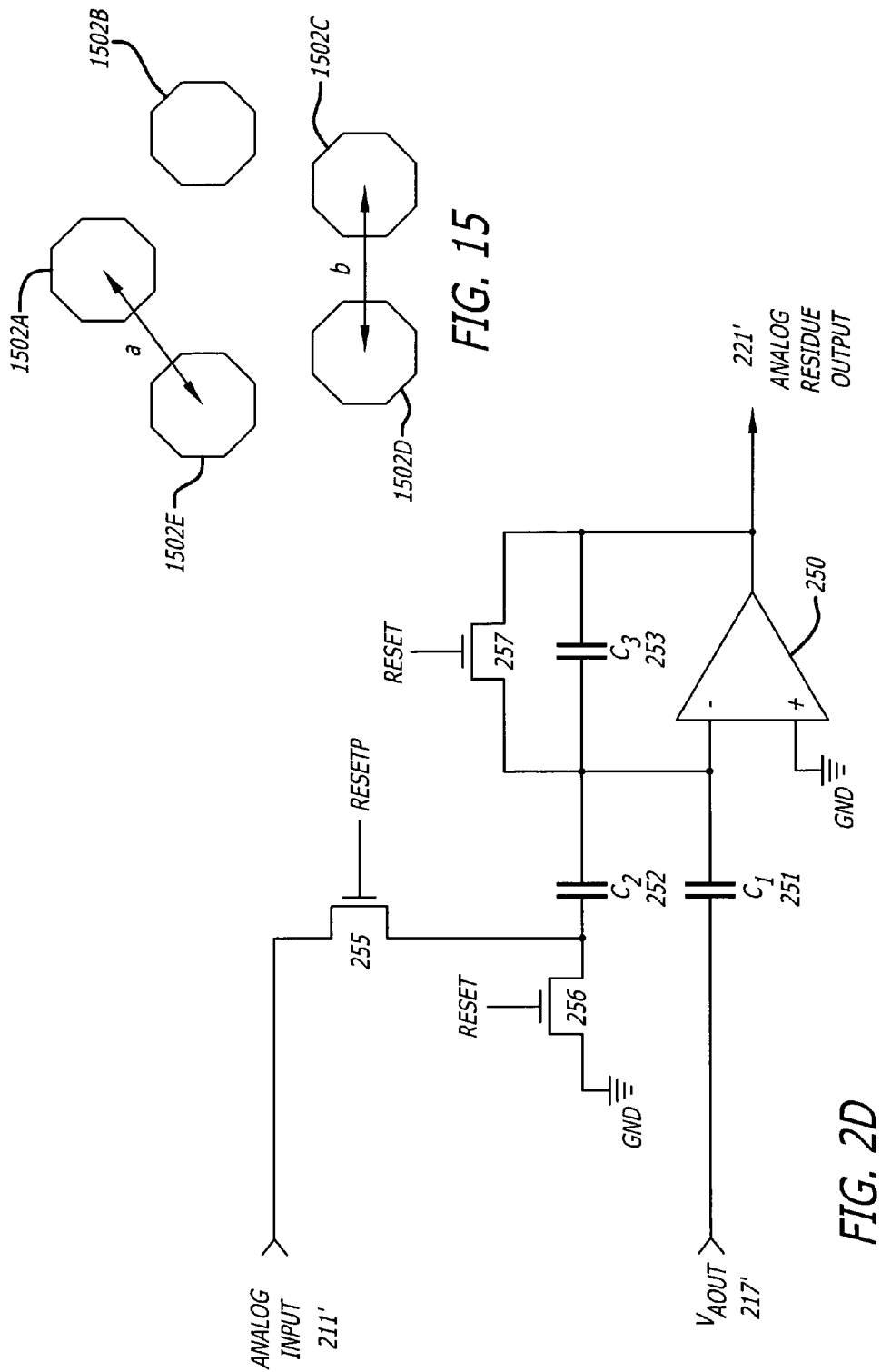

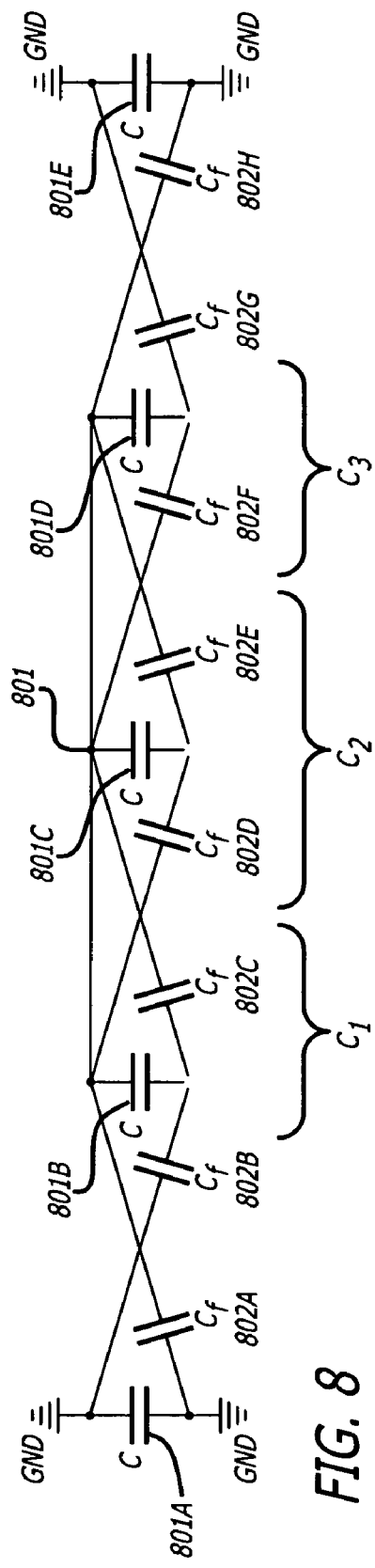
FIG. 8
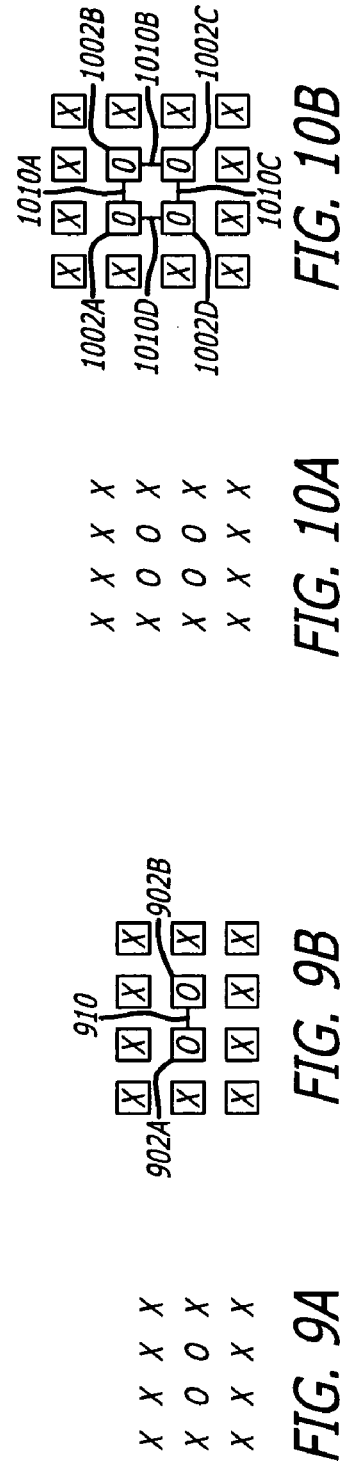
FIG. 10A
FIG. 10B
FIG. 9A
FIG. 9B

X X X X
X O O X
X X X X
X O O X
X X X X
X O O X
X X X X
FIG. 11A
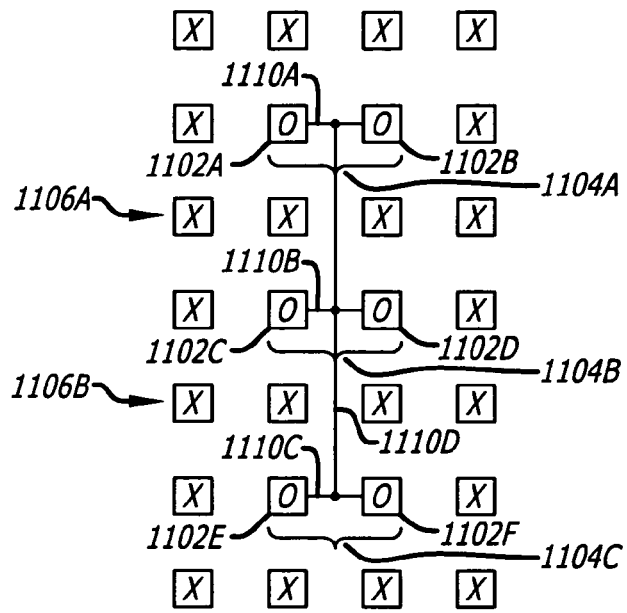
FIG. 11B
X X X X
X O O X
X O O X
X X X X
X O O X
X O O X
X X X X
FIG. 12A
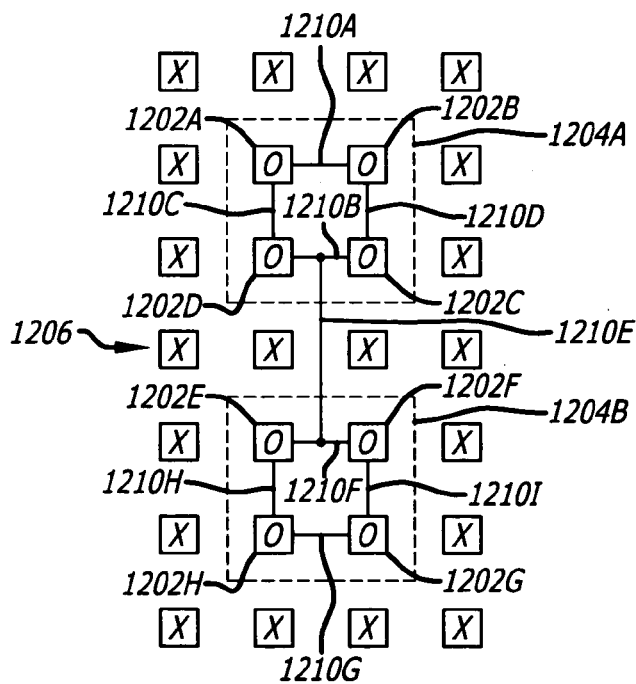
FIG. 12B

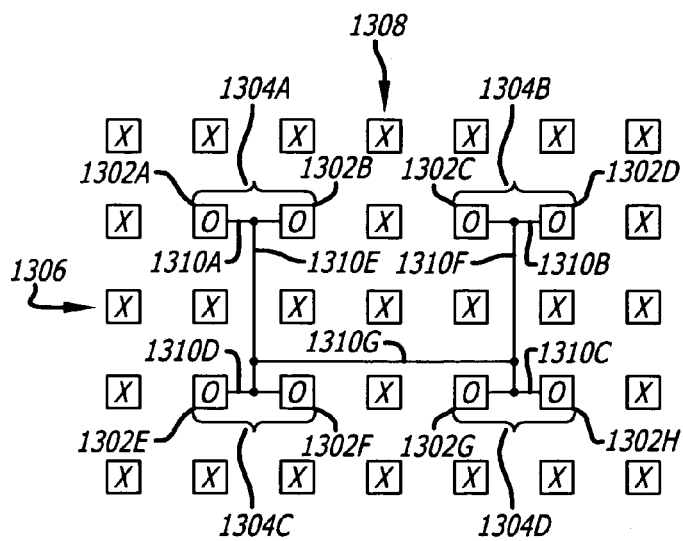
FIG. 13A
FIG. 13B
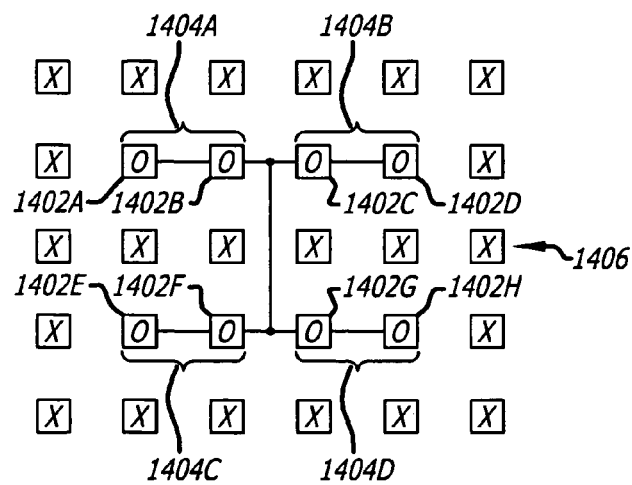
FIG. 14A
FIG. 14B

METHODS, SYSTEMS, AND APPARATUS FOR INTEGRATED CIRCUIT CAPACITORS IN CAPACITOR ARRAYS

CROSS-REFERENCE TO RELATED APPLICATION

This application is a divisional application of U.S. patent application Ser. No. 10/624,794 filed Jul. 22, 2003 now U.S. Pat. No. 7,161,516.

BACKGROUND OF THE INVENTION

1. Field of the Invention

The invention generally relates to capacitors and more specifically to capacitor arrays within an analog integrated circuit.

2. Prior Art

Capacitors are well known two terminal devices. A capacitor is a passive electrical device typically comprised of conductors separated by one or more dielectric materials. The capacitor facilitates the storage of charge when a potential difference exists between adjacent conductors. The capacitance C of a capacitor is equal to Q/V, where Q is the charge stored by the capacitor and V is the voltage between the conductors.

Various techniques and materials used in manufacturing capacitors are selected to provide the desired capacitance values and other parameters associated with a capacitor, such as the maximum voltage rating, a power rating, stability with time and temperature and/or an upper and lower temperature tolerance. The capacitance C of a capacitor is dependent on the material and dimensions of the capacitor structure, namely $C=\mu A/d$, where $\mu$ is the dielectric constant of the material used for the dielectric between the conductive capacitor plates, A is the overlapping area of adjacent capacitor plates and d is the separation of the overlapping plates. To increase the capacitance of a capacitor, one must increase the capacitor plate area, decrease the separation between capacitor plates and/or use a dielectric with a higher dielectric constant.

Capacitors connected in parallel increase the amount of total capacitance, while capacitors coupled in series decrease the total capacitance across the series combination. When coupled in parallel together, the capacitance value of each is summed together to obtain the overall capacitance. $C_1+C_2=C_{total}$, for example. When coupled in series together, the inverse capacitance value of each is summed together to obtain the inverse of the overall capacitance. $(1/C_1+1/C_2)=1/C_{total}$, for example.

A capacitor may be a discrete device with electrical leads that can be electrically coupled to a printed circuit board. Alternatively, a capacitor may be an integrated device a part of an integrated circuit, which may include other devices as a part of one semiconductor die.

Within the same semiconductor die or integrated circuit, a plurality of capacitors may be created using different material layers as the capacitor plates. Another layer of material may be used as a dielectric between the capacitor plates to electrically isolate the plates and increase the capacitance of the capacitor. The capacitors for an integrated circuit are typically defined by laying out manufacturing mask layers in order to form the appropriate material layers during manufacturing. The mask layers, when overlaid on top of one another, are oftentimes referred to as a layout.

A capacitor may be intentionally designed into an integrated circuit using the layout. Other capacitors arise unintentionally, as a consequence of manufacturing an integrated circuit. These unintentional capacitors are oftentimes referred to as parasitic capacitors. For example, around a metal oxide semiconductor field effect transistor (MOSFET), there may be a gate to drain parasitic capacitance and a gate to source parasitic capacitance due to how the MOSFET is manufactured.

BRIEF DESCRIPTION OF THE DRAWINGS

FIG. 2D is a simplified schematic diagram of an analog subtractor and gain stage for the block diagram of FIG. 2B.

FIG. 8 is a schematic diagram of five unit capacitors in a row or column of a capacitor array and the effect of not arranging active unit capacitor cells to have electrical symmetry.

FIGS. 9A-9B illustrate a first example of a first rule of the method of laying out or arranging unit capacitor cells within a capacitor array to provide visual and electrical symmetry.

FIGS. 10A-10B illustrate a second example of the first rule of the method of laying out or arranging unit capacitor cells within a capacitor array to provide visual and electrical symmetry.

FIGS. 11A-11B illustrate a first example of a second rule of the method of laying out or arranging unit capacitor cells within a capacitor array to provide visual and electrical symmetry.

FIGS. 12A-12B illustrate a second example of the second rule of the method of laying out or arranging unit capacitor cells within a capacitor array to provide visual and electrical symmetry.

FIGS. 13A-13B illustrate following a third rule of the method of laying out or arranging unit capacitor cells within a capacitor array to provide visual and electrical symmetry so there is no encroachment.

FIGS. 14A-14B illustrate encroachment when the third rule of the method of laying out or arranging unit capacitor cells within a capacitor array to provide visual and electrical symmetry is not followed.

FIG. 15 illustrates an example of a fourth rule of the method of laying out or arranging unit capacitor cells within a capacitor array to provide visual and electrical symmetry, an exception to the first rule illustrated in FIGS. 9A-10B.

DETAILED DESCRIPTION OF THE PREFERRED EMBODIMENTS

One or more integrated circuit capacitors may be formed out of a capacitor array of unit capacitors. A capacitor array may also be referred to as an array of unit capacitors or simply an array of capacitors. A capacitor array is a plurality of unit capacitors organized into a group, a set, or a regular arrangement in an integrated circuit. For example, the plurality of unit capacitors may be organized into rows and columns or be centered on a regular grid in order to form an array. The plurality of unit capacitors in a capacitor array may be interconnected together, such as in parallel, serial, or a combination thereof.

Precision capacitor arrays are an important component of analog circuits, including many analog-to-digital converters (ADC's). Accurate matching between individual unit capacitors in a capacitor array may be important to provide accurate conversion between analog signals and digital signals.

The present invention provides visual symmetry between unit capacitors in the capacitor array and electrical symmetry for active unit capacitors in the capacitor array. The benefit of visual symmetry is that similar structures have similar processing environments during various circuit fabrication stages, reducing systematic errors. The goal is to have unit cells whose matching is limited only by random variations during processing and not by systematic differences or offsets that will introduce non-random bias between unit cells.

Capacitor arrays contain two types of unit capacitors: a first set used to carry analog signals and a second set not connected to signal paths. Unit capacitors in the first set are referred to as "active" or "signal" cells and unit capacitors in the second set as "dummy" cells. The main use of dummy cells is to maintain visual symmetry and process environment uniformity for the active capacitors in the array, thus removing any systematic offset errors.

In addition to visual symmetry, matching of electrical environments is equally important. For visual symmetry, each unit capacitor in the capacitor array has equally sized (i.e., lengths, widths) and shaped capacitor plates. Furthermore, each unit capacitor in the capacitor array is formed on a grid with equal spacing between each to maintain the same visual symmetry across the entire array. Electrical symmetry, in contrast, focuses on the active unit capacitor cells and their electrical relationships with unit capacitor cells (active and dummy unit capacitor cells) around them. Particularly important in the electrical relationship of the active unit capacitor cells is that electrical parasitics be equalized to each as much as possible. If two active cells generate unequal electric fields due to for example different fringing field environments, the mismatch shows up as different capacitances of the unit cells.

Figure 1:
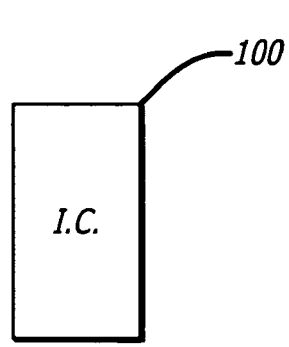
FIG. 1 is a block diagram of an integrated circuit incorporating the invention.

Referring now to FIG. 1, an integrated circuit (IC) 100 is illustrated. The integrated circuit 100 may be packaged together in a package, which may include pins for terminals for making connections to a printed circuit board. Otherwise, the integrated circuit 100 may use connector technology, such as ball grid or flip chip, to directly make electrical connections to a printed circuit board. The integrated circuit 100 is a semiconductor die, which includes active and passive electrical components formed therein. The active electrical components include transistors. The passive electrical components include capacitors. As will be discussed further below, a capacitor array of unit capacitors may be formed in the integrated circuit 100 as a stand alone capacitor, or as a part of larger circuit which includes one or more capacitors and one or more active electrical components.

Figure 2A:
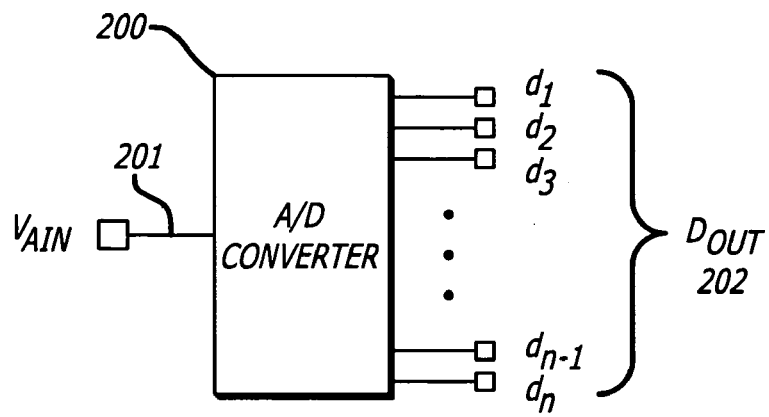
FIG. 2A is a block diagram of an analog to digital (A/D) converter incorporating the invention.

Referring now to FIG. 2A, an analog to digital (A/D) converter 200 is illustrated. The analog to digital converter 200 may be a pipelined A/D converter, a flash A/D converter, or other type of A/D converter. In any case, the A/D converter 200 may include a capacitor array. The A/D converter 200 receives an analog input signal $V_{AIN}$ 201 and generates a digital output $D_{OUT}$ 202 in response thereto. The digital output $D_{OUT}$ 202 is made up on individual digital bits $d_1$-$d_n$. Suitably weighted unit capacitors (such as equally-sized or binary-weighted) of a capacitor array may be used in the A/D converter 200.

Figure 2B:
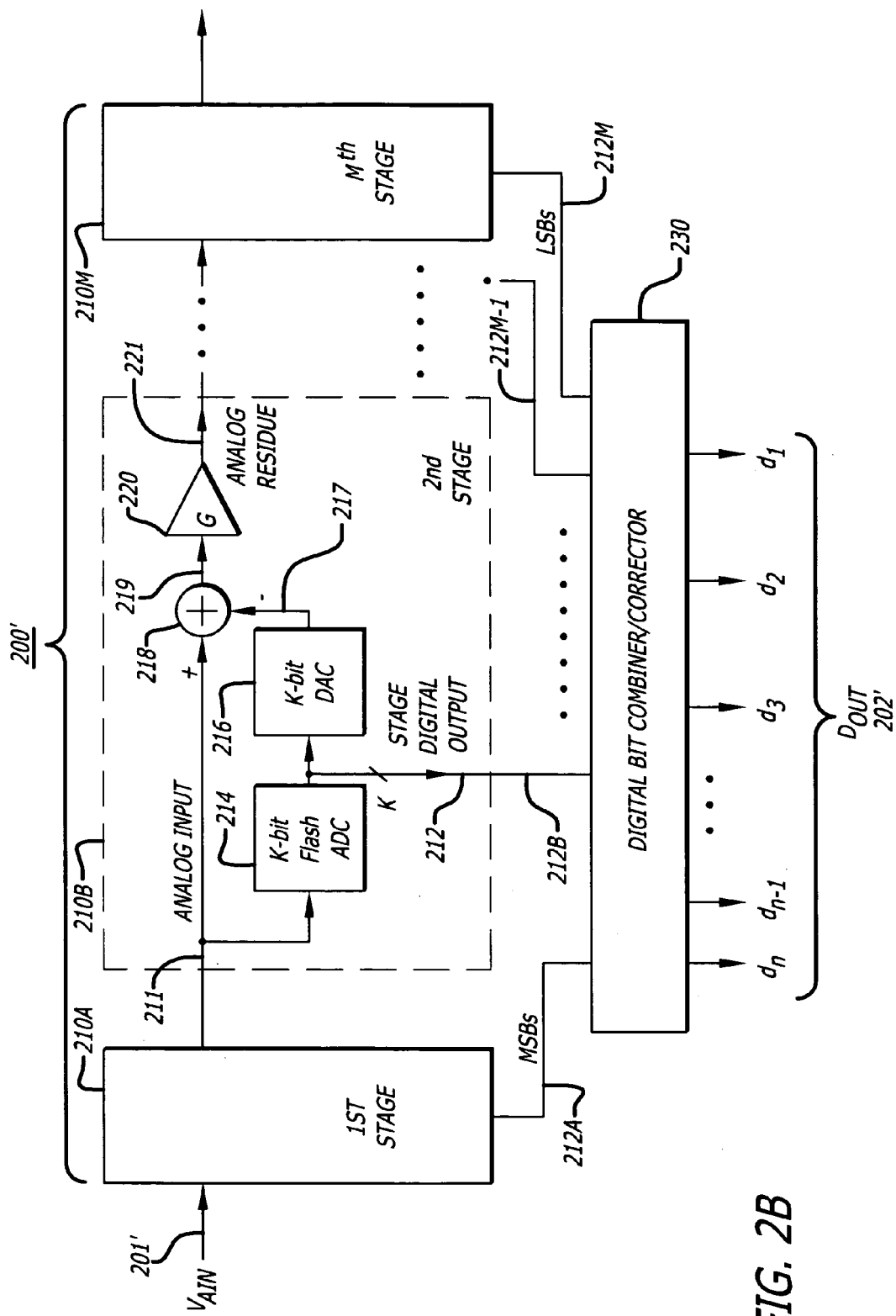
FIG. 2B is a functional block diagram of an exemplary multibit stage pipelined analog to digital (A/D) converter incorporating the invention.

FIG. 2B is a block diagram of an exemplary multibit stage pipelined analog to digital (A/D) converter 200' incorporating the invention. The pipelined A/D converter 200' receives the analog input $V_{AIN}$ 201' and generates the digital output $D_{OUT}$ 202' in response thereto.

The pipelined A/D converter 200' includes multiple converter stages 210A-210M and a digital bit combiner/corrector 230. The multiple converter stages 210A-210M are coupled in series together into a pipeline with an output of one coupled to an input of the next stage as shown in FIG. 2B. The analog input 211 of the first stage 210A is coupled to the analog input $V_{AIN}$ 201'. The analog residue 221 of the last converter stage, the $M^{th}$ stage 210M, is not coupled to an input of another stage. The digital bit combiner/corrector 230 is coupled to each of the converter stages 210A-210M to receive each respective stage digital output 212A-212M.

The first converter stage 210A provides the most coarse conversion of bits and generates the most significant bits (MSBs) of digital output 202' (i.e., at least the most significant bit and maybe one or more of the next most significant bits). The last or $M^{th}$ stage of the pipelined A/D converter 200' generates provides the finest conversion of bits and generates the least significant bits (LSBs) of the digital output 200' (i.e., at least the least significant bit and maybe one or more of the next least significant bits). The first stage 210A receives the analog input $V_{AIN}$ 201' and converts a portion of the signal generating a stage digital output 212 as the MSBs digital output. An analog residue 221 from the first stage 210A is passed onto the second stage as the analog input 211 of the second stage 210B.

The second stage 210B performs a finer conversion on the analog residue 221 from the first stage 210A generating the bits of the stage digital output 212 and the next analog residue 221, which is then passed to the next stage.

The digital bit combiner/corrector 230 receives the digital outputs 212A-212M from each stage (the "stage digital output" 212A-212M). Each stage digital output 212A-212M from each stage may be K-bits wide (with equal K-values). Alternatively, the number of K-bits may vary from stage to stage such that bit width of the stage digital output 212 may vary from stage to stage of the stages 210A-210M. For example, one or more of the stages 210A-201M nearer the analog input $V_{AIN}$ 201' (e.g., stage 210A with output 212A) may have a wider digital output (i.e., a larger value of K and bit width) than stages further away from the analog input $V_{AIN}$ 201, (e.g., stage 210M with output 212M). Different pipelined A/D converters may benefit from having different resolutions of the K-bit Flash ADC 214 providing different bit widths of the stage digital output 212A-212M in the individual stages 210A-210M. The digital bit combiner/corrector 230 combines together each of the stage digital output 212A-212M from each of the stages 210A-210M and makes corrections for any carry signals of the finer bits between stages in order to generate the data output bits d1-dm of the digital output $D_{OUT}$ 202'. The digital bit combiner/corrector 230 may additionally convert each of the stage digital output 212A-212M of each of the stages 210A-210M from one code format into another code format for the digital output $D_{OUT}$ 202'. For example, the K-bits of the stage digital output 212A-212M of each stage may be in a thermometer, binary, gray, or other coded format and the digital bit combiner/corrector 230 may generate the digital output $D_{OUT}$ 202' in a thermometer, binary, gray, or other coded format.

In FIG. 2B, the stage 210B is illustrated in its functional block diagram form which is exemplary of each of the stages 210A-210M. Each stage 210A-210M includes a K-bit Flash analog to digital converter (ADC) 214, a K-bit digital to analog converter (DAC) 216, an analog subtractor (218), and a gain stage or amplifier 220 having a gain of G, all of which are coupled together as shown in FIG. 2B. The K-bit Flash analog to digital converter (ADC) 214 generates K-bits of the stage digital output 212 within the stage as the outputs 212A-212M of the stages 210A-210M, respectively. However, the number K of K-bits and therefore the number of bits resolved at the stage digital outputs 212A-212M of each stage 210A-210M may vary from one stage to another. The more stages 210A-210M (i.e., the greater the value of M of the M stages) there are in the pipelined ADC converter 200', the greater the latency is in acquiring a digital output $D_{OUT}$ 202' from the analog input $V_{AIN}$ 201'

Within each stage, the K-bit Flash analog to digital converter (ADC) 214 functions as a fast but coarse quantizer resolving the analog input 211 into the K-bits of the stage digital output 212 of each respective stage. The K-Bit DAC 216 receives the stage digital output 212 and converts the digital quantity back into an analog quantity as the resolved analog signal portion 217.

The resolved analog signal portion 217 is subtracted from the analog input 211 by the analog subtractor 218 generating an output 219. Since the resolved analog signal portion 217 output from the DAC 216 closely approximates the analog input 211 (within the resolution of the K-bit Flash), the output 219 of the subtractor 218 is a relatively small analog signal in comparison. The output 219 is too difficult to convert any further at its given amplitude. Thus, the output 219 of the subtractor 218 is amplified by the amplifier 220, effectively having its amplitude multiplied by a gain G to produce an intermediate analog residue 221.

As discussed previously, the analog residue 221 of one stage is passed to the analog input 221 of the next stage. The analog residue 221 of the one stage is then converted by the next stage in the pipeline using another pipelined converter stage (possibly with a different number of bits resolved, i.e., L-bits). The analog residue 221 of each stage continues to be passed onto the next stage up until the last stage 210M so as to achieve a desired resolution in the digital output $D_{OUT}$ 202'. In this manner the successive stages get closer and closer to the analog input, essentially implementing a successive approximation (or "analog search") around the analog input VAIN 201'. As discussed previously, the digital output codes 212 from all stages 210A-210M are combined together by the combiner 230 to produce a final result of the digital output $D_{OUT}$ 202'.

The accuracy of the K-bit DAC 216 is important in forming a precise analog to digital converter and more accurately resolving the analog input signal $V_{AIN}$ 201' into the digital output $D_{OUT}$ 202'. Assuming that the ADC 200' is to generate a digital output DOUT 202' with a total of N bits (d1-dn), the K-bit Flash ADC does not need to be N-bit accurate (K-bit accuracy is approximately sufficient). However, it is desirable that DAC 216 receive the K-bits from the K-bit Flash ADC and generate an N-bit accurate analog output signal, at least in the first stage, in order to provide a more accurate ADC 200'. This is so an accurate analog residue 221 may be formed for the next stage.

For example, a four bit (K=4 bits) input DAC may be formed to generate an analog output accurate to an LSB at fourteen bits (N=14 bits) which generates sixteen different analog voltage levels and is accurate to within thirty parts per million (30 PPM) or one part in $2^{15}$ of the ideal output.

However, if the K-bit DAC 216 does not generate an N-bit accurate analog output signal in the first stage, there are other techniques that may be used to compensate, such as calibration and dynamic element matching to improve accuracy. The more accuracy provided in a design of the first stage, the easier it may to meet other design parameters such as power, noise, and speed.

The DAC 216 within a stage 210A-210M is often implemented by using a capacitor array with equal sized capacitors. That is, each capacitor has a capacitance that is substantially equal to the capacitance of every other capacitor. In other words, the capacitors in the capacitor array substantially match each other. The number of capacitors in the capacitor array is generally close to $2^K$. Each of the equal capacitors is carefully configured within the array of unit cells of the capacitor array so that they substantially match each other and provide an accurate conversion. Thus, improving the matching of the equal capacitors in the capacitor array may improve the performance of the DAC 216 with respect to accuracy, speed, power, and ease of implementation.

Note that in an alternate embodiment of the pipelined analog-to-digital converter 200', the Mth stage may be slightly altered as it is the last stage in the converter and the analog residue output 221 is unnecessary. In which case, the last stage may eliminate the elements of the K-bit DAC 21, the subtractor 218, and the amplifier 220 such that K-bit flash ADC 214 remains to generate the last stage digital output 212M.

Figure 2C:
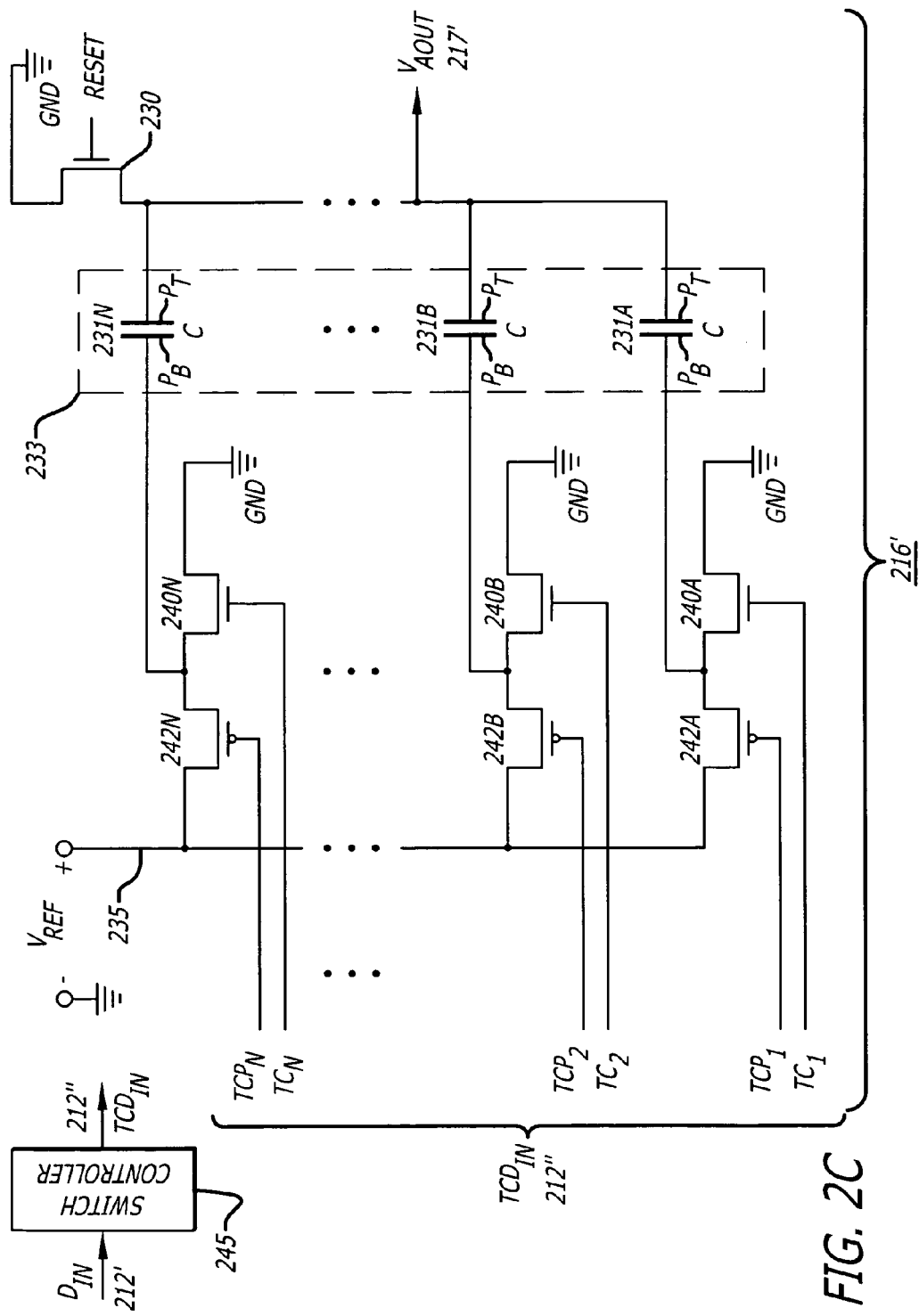
FIG. 2C is a simplified schematic diagram of a digital to analog converter (DAC) with an equally-sized or equally-weighted capacitor ladder incorporating the invention.

Referring now to FIG. 2C, a block diagram of an exemplary digital to analog converter (DAC) 216' with an equally-sized or equally-weighted capacitor ladder 233 incorporating the invention is illustrated.

The DAC 216' receives a digital input signal $D_{IN}$ 212' and generates an analog output signal $V_{AOUT}$ 217'. The digital input signal $D_{IN}$ 212' may be encoded as a binary code, a thermometer code, a gray code, or another type of code. The digital input signal $D_{IN}$ 212' may couple into a switch controller 245 to generate switch control signals $TCD_{IN}$ 212" (made up of $TC_1$-$TC_N$ and $TCP_1$-$TCP_N$). Alternatively, if the individual bit signals of the digital input signal $D_{IN}$ 212' are in an appropriately coded format, they may couple directly into the DAC 216' in order to control the switches. The digital input signal $D_{IN}$ 212' may be representative of the digital stage output 212 and the analog output signal $V_{AOUT}$ 217' may be representative of the resolved analog signal portion 217 within in each stage 210A-210M of FIG. 2B.

The DAC 216' includes a first set of N switches 240A-240N, a second set of switches 242A-242N, a reset switch 230, and, the equally-sized or equally-weighted capacitor ladder 233 coupled together as shown in FIG. 2C. Each switch of the switches 240A-240N and 242A-242N has a switch control terminal and a pair of poles across which the switch opens and closes.

The first set of switches 240A-240N and the reset switch 230, in one embodiment are n-channel metal oxide semiconductor field effect transistors (i.e., NMOS transistors). The second set of switches 242A-242N, in one embodiment, are p-channel metal oxide semiconductor field effect transistors (i.e., PMOS transistors). In this case, the first set of switches 240A-240N and the reset switch 230 are responsive to a positive signal applied to their switch control terminals or gates and the second set of switches 242A-242N are responsive to a negative signal or a low signal level (i.e., substantially zero volts or a negative power supply voltage) applied to their switch control terminals or gates. In which case, the $TC_1$-$TC_N$ and $TCP_1$-$TCP_N$ Of the switch control signals $TCD_{IN}$ 212" may be the same signals such that the respective switch control terminals or gates of the first set of switches 240A-240N and the second set of switches 242A-242N may be coupled together and coupled to the same individual signals of the switch control signals $TCD_{IN}$ 212'.

It is understood that the switch types are interchangeable and that an appropriate active low or active high signal is provided to the switch control terminal to close and open the switch. Furthermore, different switching transistors may be used as the switches 240A-240N and 242A-242N such as bipolar, FET, or bi-CMOS transistor switches. In the one embodiment illustrated and these alternate embodiments, the switch controller 245 can provide the appropriate type of control signal to control the switching of the various switch types.

The capacitor array 233 includes the capacitors 231A-231N, which are equally weighted. That is, the capacitance of each of the capacitors 231A-231N has substantially the same capacitance C so they are matched. The equally weighted capacitors 231A-231N are formed by selecting unit capacitors to be active within the capacitor array with substantial visual and electrical symmetry, in accordance with the invention. Each of the capacitors 231A-231N has a bottom plate $P_B$ and a top plate $P_T$. In a preferred embodiment, the top plate $P_T$ of each capacitor 231A-231N is coupled together and to the analog output $V_{AOUT}$ 217'. Accordingly, the bottom plate $P_B$ of each respective capacitor 231A-231N of the capacitor array 230 are coupled to a respective pole of the second set of switches 242A-242N and a respective pole of the first set of switches 240A-240N. The capacitors 231A-231N formed in the capacitor array 230 may alternatively be referred to as an equal weighted or equally weighted capacitor ladder or array, or a linear or segmented capacitor ladder or array.

The reset switch 230 has one pole coupled to ground, another pole coupled to $V_{AOUT}$ 217' and its control terminal coupled to a RESET signal. The first set of switches 240A-240N have one pole coupled to a first voltage reference ($V_{REF-}$) or ground as shown and another pole coupled to the bottom plate $P_B$ of respective capacitors 231A-231N of the capacitor array 230 and a respective pole of the second set of switches 242A-242N. The respective control terminal of the switches 240A-240N couple to the corresponding input signal TC1-TCN of the digital input $TCD_{IN}$ 212" and the respective control terminal of the switches 242A-242N couple to the corresponding input signal TCP1-TCPN of the digital input $TCD_{IN}$ 212". Each of the second set of switches 242A-242N have a pole coupled together and coupled to a second voltage reference source $V_{REF+}$ 235. The second set of switches 242A-242N each have another pole coupled to a respective pole of the first set of switches 240A-240N and to the respective bottom plate $P_B$ of the respective capacitors 231A-231N.

In operation, the illustrated embodiment of the DAC 216' is first initialized or reset by having the RESET signal go active high and close the reset switch 230 to discharge the analog output $V_{AOUT}$ 217' and the top plate $P_T$ of each capacitor 231A-231N in the capacitor array 233 to ground. At the same time, the digital input $TCD_{IN}$ 212" is set to zero (e.g., each $TC_1$-$TC_N$ set to zero and each $TCP_1$-$TCP_N$ set to one) so that switches 240A-240N are open and switches 242A-242N are all closed to connect the bottom plate $P_B$ of each capacitor 231A-231N in the capacitor array 233 to the reference voltage $V_{REF+}$ 235. In another embodiment, $TCD_{IN}$ 212" closes selected ones of switches 240A-240N to connect the bottom plate $P_B$ of selected ones of capacitors 231A-231N in the capacitor array 233 to a reference voltage $V_{REF-}$ and closes selected ones of switches 242A-242N to connect the bottom plate $P_B$ of selected ones of capacitors 231A-231N in the capacitor array 233 to the reference voltage $V_{REF+}$ 235. In any case, the initialization or reset establishes a reference voltage (VREF+ or VREF−) across each of the capacitors 231A-231N in the capacitor array 233.

After initialization or reset, the RESET signal goes low opening the reset switch 230 and isolating ground so that a voltage can be generated on the analog output $V_{AOUT}$ 217'. The switch controller 245 can then generate the appropriate switch control signals $TCD_{IN}$ 212" in response to the digital input $D_{IN}$ 212' that requires conversion. The individual switch control signals of $TCD_{IN}$ 212" that remain set to the reset state do not alter the charge across their respective capacitor 231A-231N as the switches 242A-242N remain closed and keep VREF+ or VREF− connected thereto. The individual switch control signals of $TCD_{IN}$ 212" that change state out of the reset state switch on (i.e., close) the respective switches 240A-240N through their respective switch control terminals and switch off (i.e., open) the respective switches 242A-242N through their respective switch control terminals. This causes ground to be coupled to the bottom plates $P_B$ of respective capacitors 231A-231N to which these respective switches 240A-240N are coupled and turned on. The voltage across respective capacitors 231A-231N is altered and causes a proportional voltage to be imposed on the analog output $V_{AOUT}$ 217'.

Assuming that the switch control signals $TCD_{IN}$ 212" are thermometer code, providing a thermometer code of height m (i.e., m of the $TC_1$-$TC_N$ signals are set to a logical one to represent the digital signal $TCD_{IN}$ 212" to be converted to an analog signal) set as the input $TCD_{IN}$ 212", the output voltage can be determined from the equation $V_{AOUT} = (m/N) \times V_{REF}$ where N is the total number of capacitors 231A-231N. In order to provide the analog output $V_{AOUT}$ 217' accurately, it is desirable that the capacitors 231A-231N of the capacitor ladder 233 have an equal capacitance value. That is, the better matched each capacitor 231A-231N is, the more accurate are the output results of the conversion of $D_{IN}$ 212' into $V_{AOUT}$ 217'.

DAC 216' has been described here in particular detail, including the connections to positive reference, negative reference, and input voltages, as one embodiment of a DAC that may used as the DAC 216 in each stage of the multibit stage pipelined analog to digital (A/D) converter of FIG. 2B, while the number of K-bits of resolution may vary from one stage to the next. The embodiment of DAC 216' may be modified in that different switches, switch positions and switch configurations may be used to couple to the capacitor array 233 in the implementation of a DAC. For example, a fully differential output may be desirable. In which case, fully differential switch circuits may used which may reduce the number of N capacitors in the capacitor ladder 233. However in any embodiment, the N capacitors in the capacitor ladder 233 are formed of equally-sized active unit capacitors and dummy unit capacitors in a capacitor array to provide both visual symmetry and electrical symmetry in accordance with the invention hereof.

Referring now to FIG. 2D, a simplified schematic diagram of embodiments an analog subtractor 218 and gain stage 220 for the functional block diagram of FIG. 2B is illustrated. The embodiment of the analog subtractor 218 and gain stage 220 illustrated in FIG. 2D includes an operational amplifier 250, capacitors C1 251 through C3 253, and switches 255-257 coupled together as shown and illustrated. The circuitry receives the analog output voltage $V_{AOUT}$ 217' from the K-bit DAC 216' and the analog input 211' associated with the respective stage 210A-210M of the pipelined analog-to-digital converter 200'. The circuitry generates an analog residue output 221' for the respective stage 210A-210M of the pipelined analog-to-digital converter 200'.

During reset, switches 256 and 257 are closed by the RESET signal while the switch 255 is open by a RESETP signal to reset the analog subtractor 218 and gain stage 220. After reset, the switch 255 is closed by the RESETP signal and the switches 256 and 257 are opened by the RESET signal so that the circuitry can subtract the analog output voltage $V_{AOUT}$ 217' from the analog input 211' and amplify the result to generate the analog residue output 221'. The RESET signal and RESETP signals may be opposite phased clock signals or a pair of non-overlapping two phase clock signals.

Figure 2E:
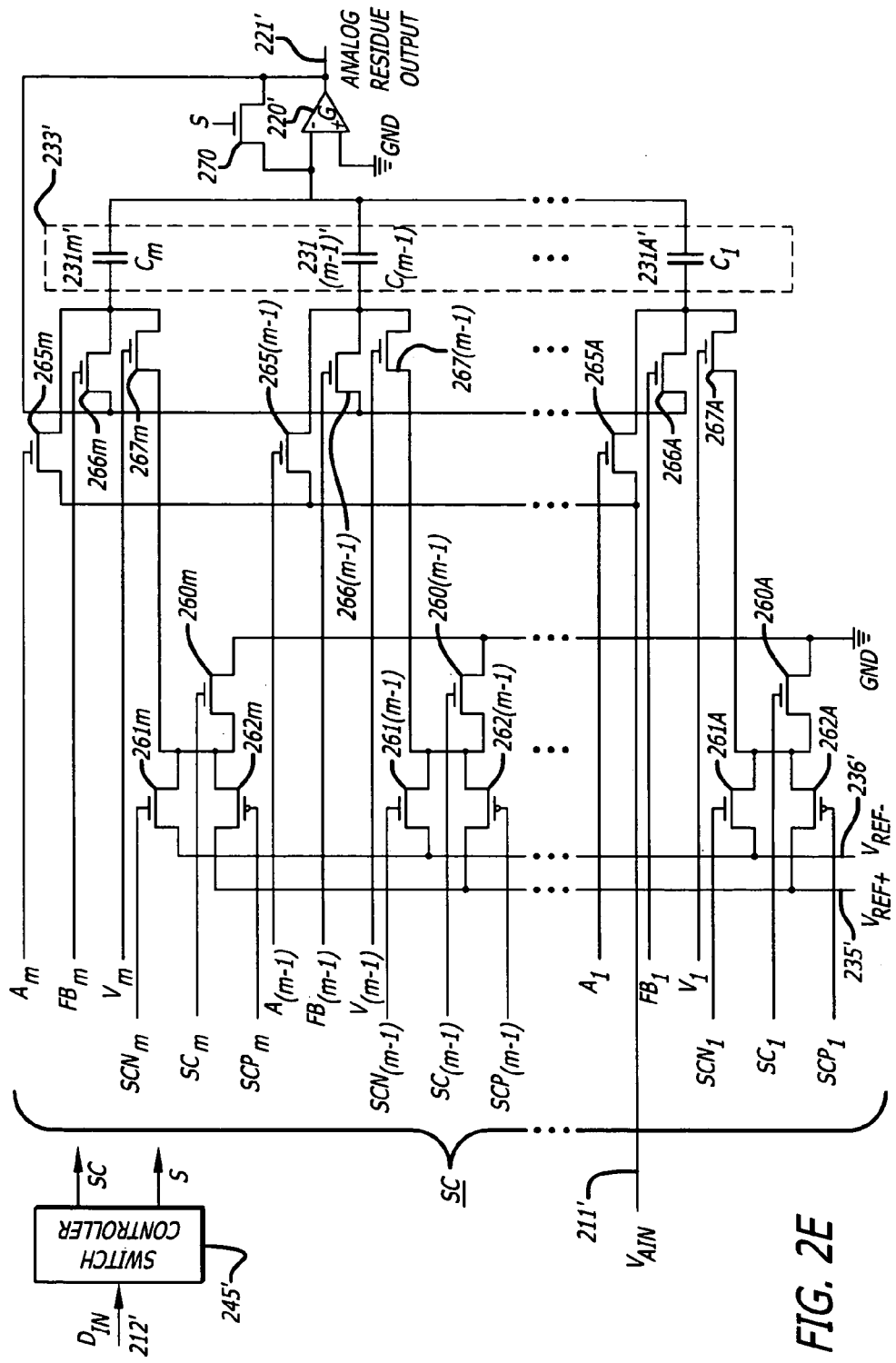
FIG. 2E is a simplified schematic diagram of a multiplying digital to analog converter (MDAC) with a capacitor array incorporating the invention and functioning as the k-bit DAC, analog subtractor, and gain stage for the block diagram of FIG. 2B.

Referring now to FIG. 2E, a simplified schematic diagram of a multiplying digital to analog converter (MDAC) as an embodiment integrating the functionality of the k-Bit DAC 216, the analog subtractor 218 and gain stage 220 together of the functional block diagram of FIG. 2B is illustrated. The multiplying digital to analog converter receives the analog input signal $V_{AIN}$ 211' and the digital input signal $D_{IN}$ 212' to generate the analog residue output 221'. The circuitry receives the analog input 211' associated with the respective stage 210A-210M of the pipelined analog-to-digital converter 200'. The circuitry generates the analog residue output 221' for the respective stage 210A-210M of the pipelined analog-to-digital converter 200'.

A first embodiment of the multiplying digital to analog converter includes an operational amplifier 220', capacitors $C_1$ 261A' through $C_M$ 261M', a plurality of M switches 260A-260M, a plurality of switches 261A-261M, a plurality of M switches 262A-262M, a plurality of switches 265A-265M, a plurality of M switches 266A-266M, a plurality of M switches 267A-267M, a sample/reset switch 270, and a switch controller 245' coupled together as shown and illustrated in FIG. 2E. Each of the switches in the $M_{DAC}$ includes a first pole, a second pole, and a switch control terminal or gate.

Capacitors $C_1$ 261A' through $C_M$ 261M' form the capacitor array 233'. The active capacitors $C_1$ 261A' through $C_M$ 261M' of the capacitor array 233' are arranged amongst dummy capacitors to provide visual and electrical symmetry in accordance with the invention.

The switch controller 245' receives the digital input signal $D_{IN}$ 212' from the flash analog to digital converter 214 for the respective stage 210A-210M of the pipelined analog-to-digital converter 200' and generates appropriate switch control signals SC and the switch control signal S. The switch control signals SC include switch control signals $SCP_1$-$SCP_m$, $SC_1$-$SC_m$, $SCN_1$-$SCN_m$, $V_1$-$V_m$, $FB_1$-$FB_m$, and $A_1$-$A_m$ which are coupled to the appropriate switch control terminals of the plurality of switches 260A-260M, the plurality of switches 261A-261M, the plurality of switches 262A-262M, the plurality of switches 265A-265M, the plurality of switches 266A-266M, and the plurality of switches 267A-267M as shown and illustrated in FIG. 2E. The switch control signal S is coupled to the switch control terminal of the switch 270.

The plurality of switches 265A-265M may be referred to as analog input switches with each having a first pole coupled together and to the analog input $V_{AIN}$ 211'. A second pole of each of the plurality of switches 265A-265M is respectively coupled to a first plate (preferably the bottom plate) of the capacitors $C_1$ 261A' through $C_M$ 261M'. The switch control terminal of each of the plurality of switches 265A-265M is respectively coupled to the $A_1$-$A_m$ switch control signals.

The plurality of switches 266A-266M may be referred to as feedback switches with each having a first pole coupled together and to the analog residue output 221'. A second pole of each of the plurality of switches 266A-266M is respectively coupled to the first plate (preferably the bottom plate) of the capacitors $C_1$ 261A' through $C_M$ 261M' and to the respective second pole of each of the plurality of switches 265A-265M. The switch control terminal of each of the plurality of switches 266A-266M is respectively coupled to the $FB_1$-$FB_m$ switch control signals.

The plurality of switches 267A-267M may be referred to as voltage reference switches with a first pole of each respectively coupled to a corresponding first pole of the switches 260A-260M, 261A-261M, and 262A-262M, respectively. A second pole of each of the plurality of switches 267A-267M is respectively coupled to the first plate (preferably the bottom plate) of the capacitors $C_1$ 261A' through $C_M$ 261M' and to the respective second pole of each of the plurality of switches 265A-265M and 266A-266M. The switch control terminal of each of the plurality of switches 267A-267M is respectively coupled to the $V_1$-$V_M$ switch control signals.

The plurality of switches 260A-260M may be referred to as ground reference switches with a first pole of each respectively coupled to the corresponding first pole of the switches 267A-267M, 261A-261M, and 262A-262M, respectively. A second pole of each of the plurality of switches 260A-260M are coupled together and to the low level voltage supply or ground GND. The switch control terminal of each of the plurality of switches 260A-260M is respectively coupled to the $SC_1$-$SC_m$ switch control signals.

The plurality of switches 261A-261M may be referred to as negative reference switches with a first pole of each respectively coupled to the corresponding first pole of the switches 267A-267M, 260A-260M, and 262A-262M, respectively. A second pole of each of the plurality of switches 261A-261M are coupled together and to a negative voltage reference $V_{REF-}$ 236'. The switch control terminal of each of the plurality of switches 261A-261M is respectively coupled to the $SCN_1$-$SCN_m$ switch control signals.

The plurality of switches 262A-262M may be referred to as positive reference switches with a first pole of each respectively coupled to the corresponding first pole of the switches 267A-267M, 260A-260M, and 261A-261M, respectively. A second pole of each of the plurality of switches 262A-262M are coupled together and to the positive voltage reference $V_{REF+}$ 235'. The switch control terminal of each of the plurality of switches 262A-262M is respectively coupled to the $SCP_1$-$SCP_m$ switch control signals.

Different types of switches may be used to implement switches 260A-260M, 261A-261M, 262A-262M, 265A-265M, 266A-266M, and 267A-267M. In one embodiment, the switches 260A-260M, 261A-261M, 262A-262M, 265A-265M, 266A-266M, and 267A-267M are fully complementary CMOS switches each including an NFET and a PFET. In another embodiment, the switches 260A-260M, 261A-

261M, 265A-265M, 266A-266M, and 267A-267M are NFETs and switches 262A-262M are PFETS. In another embodiment, they are NFET switches. In yet another embodiment, they are PFET switches. In yet another embodiment, they are bipolar junction transistor (BJT) switches. In yet another embodiment, they are GaAs field effect transistors (FETs).

The multiplying digital to analog converter functions in a switch capacitor mode via the timing of the switch control signal S and the timing of the settings of the other switches therein. The multiplying digital to analog converter functions to reduce the level of the analog input $V_{AIN}$ 211' by an appropriate amount representing the digital input $D_{IN}$ 212' and generate the analog residue output 221'.

FIG. 2E illustrates one embodiment of the multiplying digital to analog converter (MDAC). However, the multiplying digital to analog converter may be implemented in a number of ways. In another embodiment, the switches 260M, 261M, 262M, 266A-266(M-1), and 267M are eliminated from the embodiment illustrated in FIG. 2E. In yet another embodiment the number of capacitors is doubled such that M=2×M and the switches 260A-260M, 261(M-1), 261M, 262(M-1), 262M, 266A-266(M-2), 267(M-1), and 267M are eliminated from the embodiment illustrated in FIG. 2E. In still yet another embodiment, the analog residue output 221' is a double ended differential output and the reset switch 270 does not have the one pole coupled to the input of the operational amplifier 220' but to a common mode voltage supply instead.

In any embodiment of the MDAC, the capacitor array therein is implemented to provide visual and electrical symmetry in accordance with the invention.

Figure 3:
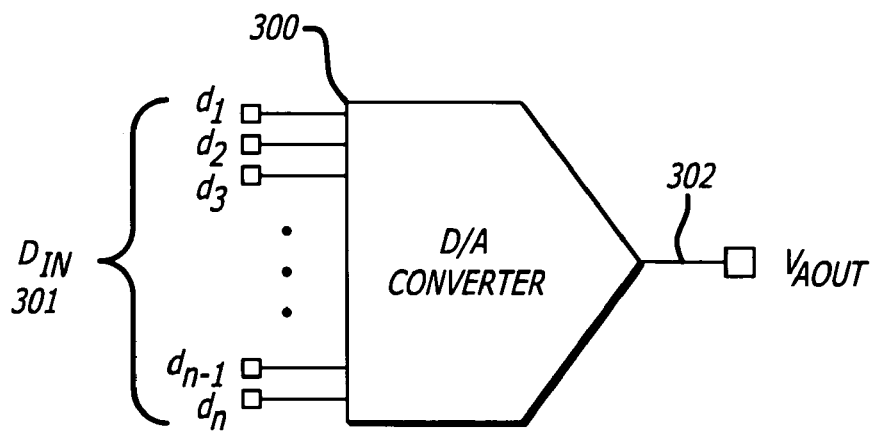
FIG. 3 is a block diagram of a digital to analog converter (DAC) incorporating the invention.

Referring now to FIG. 3, a digital to analog converter (DAC) 300 is illustrated. The digital to analog converter 300 receives the digital input $D_{IN}$ 301 and generates an analog output $V_{AOUT}$ 302 in response thereto. The digital input $D_{IN}$ 301 is formed of bits $d_1$-$d_n$. The DAC 300 functions to convert a digital input signal into an analog output signal. In contrast, the analog to digital converter 200 converts an analog input signal into a digital output signal. The digital to analog converter 300 may include a capacitor array to facilitate the conversion of a digital input signal into an analog output signal, as will be discussed further below. The capacitor array may provide ratioed capacitors as part of a flash A/D converter, or suitably-weighted capacitor ladder (e.g., binarily-weighted or equally-weighted) as part of a digital to analog converter used to approximate an analog signal and generate a comparison bit within a pipelined successive approximation A/D converter.

Figure 4:
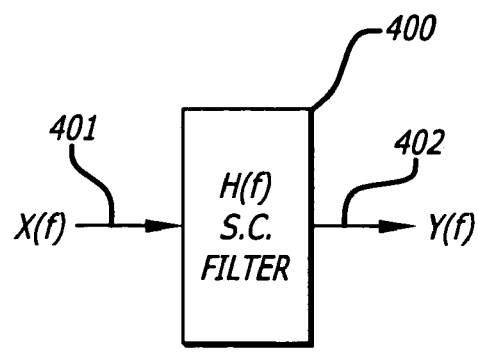
FIG. 4 is a block diagram of a switched capacitor (SC) filter incorporating the invention.

Referring now to FIG. 4, a switch capacitor (SC) filter 400 is illustrated. The switch capacitor filter 400 may include a capacitor array to facilitate the formation of capacitors that may be ratioed with other capacitors to provide a desired filter response H(f). The switch capacitor filter 400 receives an analog input signal X(f) 401. In response to the desired filter response H(f) and the analog input signal X(f) 401, the switch capacitor filter 400 generates an analog output signal Y(f) 402.

The analog to digital converter 200, the digital to analog converter 300, and/or the switch capacitor filter 400 may each be part of an integrated circuit 100 or otherwise provide the overall function the integrated circuit 100. That is, the integrated circuit 100 may be a digital to analog converter. Alternatively, the integrated circuit 100 may be an analog to digital converter. In another case the integrated circuit 100 may be a filtering circuit and include the switch capacitor filter 400.

Figure 5:
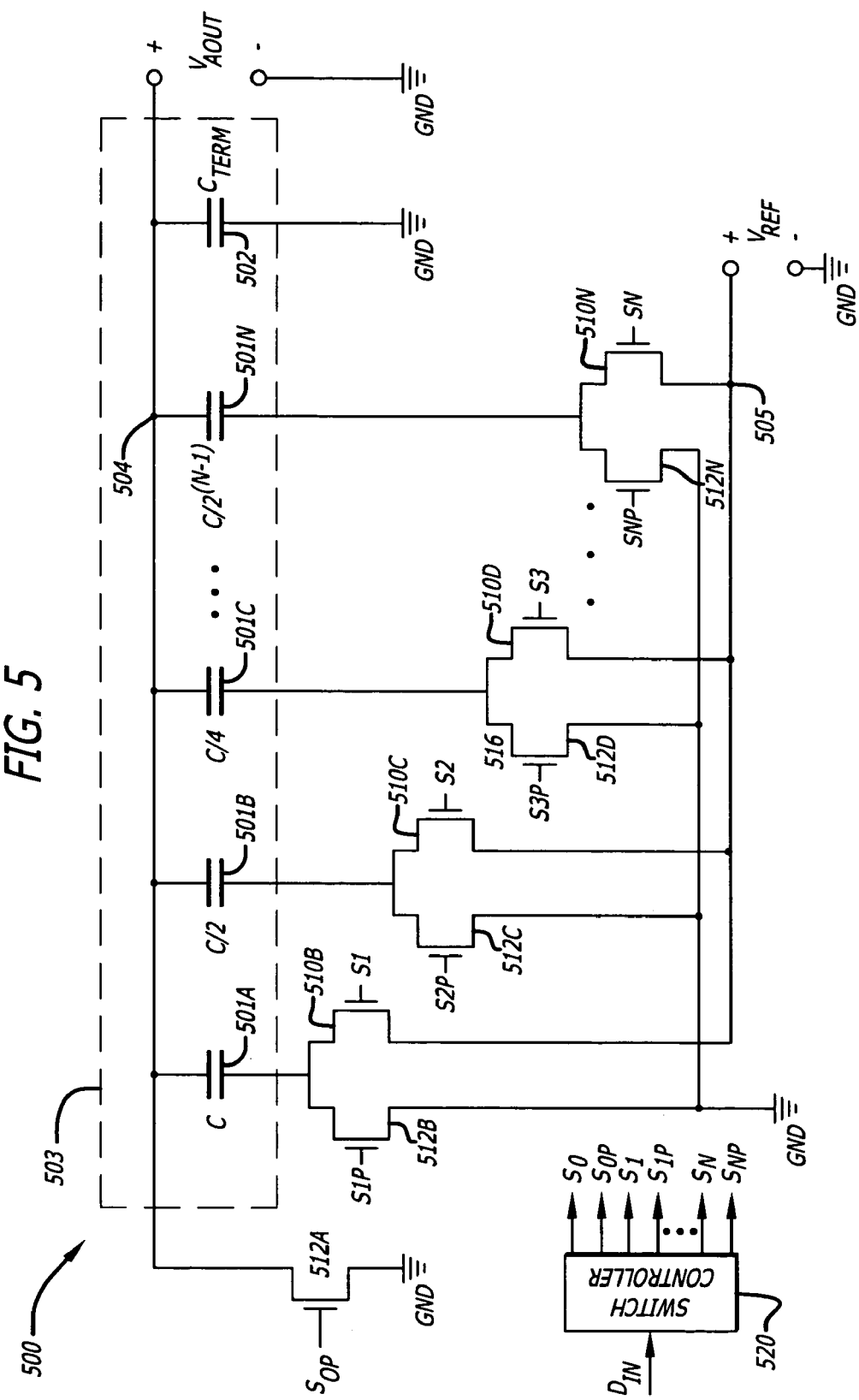
FIG. 5 is a schematic diagram of a charge-scaling digital to analog converter with a binary-weighted capacitor ladder including integrated circuit capacitors formed in a capacitor array by the methods described herein.

Referring now to FIG. 5, one example embodiment of a charge scaling digital to analog converter (DAC) 500 is illustrated. The charge scaling DAC 500 may be a part of the A/D converter 200 or the DAC 300 and integrated within the integrated circuit 100.

The exemplary charge scaling DAC 500 includes capacitors 501A-501N, capacitor 502, switches 510B-510N, switches 512A-512N, and a switch controller 520 as shown and illustrated coupled together in FIG. 5. As discussed previously, the capacitors 501A-501N and capacitor 502 may be implemented in a capacitor array. Capacitors 501A-501N and capacitor 502 in this example represent a binary weighted capacitor ladder 503. The capacitors 501A-501N and capacitor 502 can form ratioed capacitor values multiplied by the reference voltage $V_{REF}$, in response to the settings (i.e., closed or open) of switches 510B-510N and switches 512A-512N.

Within the binary weighted capacitor ladder 503, the first capacitor 501A may have a capacitance of C. Capacitor 501B may have a capacitance of one-half of C. Capacitor 501C may have a capacitance of one-fourth C. Capacitor 501N, the Nth capacitor in the switched legs of the binary weighted capacitor ladder, may have a capacitance value of C divided by two to the N-1 power ($C/2^{N-1}$). The capacitor 502 is a termination capacitor that is often added to force the sum of capacitances 501B-501N plus 502 to equal C, the capacitance of element 501A. The termination capacitor 502 may have a capacitance equal to the capacitance of capacitor 501N. Each capacitor 501A-501N and capacitor 502 has a terminal coupled to a common node 504. Node 504 is also the analog voltage output terminal $V_{AOUT}$ of the charge scaling DAT 500 upon which the analog output voltage is formed. Each of the capacitors 501A-501N have a second terminal coupled to a pair of switches, one respectively from the switches 510B-510N and another one respectively from the switches 512B-512N. The termination capacitor 502 has a first terminal coupled to the common node 504 and a second terminal coupled to ground.

The switches 512A-512N and 510B-510N of the charge scaling DAC may each be n-channel metal oxide semiconductor field effect (NMOS) transistor switches, p-channel metal oxide semiconductor field effect (NMOS) transistor switches, complementary metal oxide semiconductor field effect (CMOS) transistor switches, bipolar junction transistor switches, combinations thereof, other transistorized switches, or other types of electronically controlled switches. Switches 512A-512N each have one pole of the switch coupled to ground. Switches 510B-510N each have one pole of the switch coupled to a common node 505 to receive the voltage reference $V_{REF}$. Switches 510B-510N and switches 512B-512N have a second pole commonly coupled together to each respective terminal of the capacitors 501A-501N. Switch 512A has one pole coupled to ground and a second pole coupled directly to the common node 504. In this manner, switch 512A can ground out the analog voltage output $V_{AOUT}$ and discharge one plate of each of the capacitors 501A-501N and capacitor 502. Switches 512A-512N each have a control terminal (i.e., a gate or a base) coupled to a respective switch control signal S0P-SNP. Switches 510B-510N each have a control terminal (i.e., a gate or a base) coupled to a respective switch control signal S1-SN.

The switch controller 520 receives a data input signal DIN and generates the switch control signals S1-SN and S0P-SNP. The switch control signals are coupled to the control terminals of the switches (i.e., switches 510B-510N and switches 512A-512N) of the charge scaling DAC 500. In response to the digital input signal $D_{IN}$, the switch controller 520 generates appropriate switch control signals to turn on one or more of the appropriate switches to select one or more of the capacitors 501A-501N to have a capacitor plate coupled to ground or to $V_{REF}$ 505. In this manner, one side of the capacitor plates can be charged up to $V_{REF}$ or held discharged to ground. Switch 510A, when turned on, can ground one plate of each of the capacitors 501A-501N. Switches 512A-512N, if turned on, can ground the opposite plate of each of the respective capacitors 501A-501N to ground.

In operation, the charge scaling DAC 500 has a reset mode and a sample mode. In a reset mode switches 512A-512N are switched on to ground each side of the capacitor plates of the capacitors 501A-501N. In the reset mode, switches 510B-510N are all turned off. In a sampling mode, switch 512A is turned off so that the common node 504 is not grounded out and an analog voltage output $V_{AOUT}$ may be generated thereon. In response to the data input signal $D_{IN}$, the switch controller 520 selectively turns on certain ones of the switches 510B-510N and turns off respective ones of the corresponding switches 512B-512N so that the opposite capacitor plate is not grounded. Those certain ones of the switches 510B-510N turned on couple the analog voltage level of $V_{REF}$ 505 into the respective capacitors 501A-501N. Those unselected which do not have switches 510B-510N turned on, have their respective switches 512B, 512N turned on so that the capacitor plate remains coupled to ground. In this manner, the charges of $V_{REF}$ are coupled into the capacitor plates of selective capacitors.

The analog voltage output $V_{AOUT}$ on the common node 504 is proportional to an equivalence capacitor value $C_{eq}$ formed by capacitors selected by $D_{IN}$ divided by the sum of all of the capacitance of the capacitors 501A-501N and capacitor 502. That is, $V_{AOUT}=V_{ref}(C_{eq}/C_{total})$. With data bits $d_1$-$d_n$ of $D_{IN}$ being either a logical one or zero, the equivalence capacitor value $C_{eq}$ is selected by the data bits and may be written in equation form as $C_{eq}=d_1C+d_2(C/2)+d_3(C/4)+ \ldots +d_N(C/2^{N-1})$. $C_{total}$ may be written in equation form as $C_{total}=C+(C/2)+(C/4)+\ldots+(C/2^{N-1})+(C/2^{N-1})=2C$. Thus, the analog output voltage $V_{AOUT}=V_{ref}(C_{eq}/C_{total})$ may be reduced to $V_{AOUT}=V_{ref}[d_1 2^{-1}+d_2 2^{-2}+d_3 2^{-3}+\ldots+d_N 2^{-N}]$. However in order for this equation to be accurate, the accuracy of the capacitors and the ratio of the capacitances are important.

Figure 6:
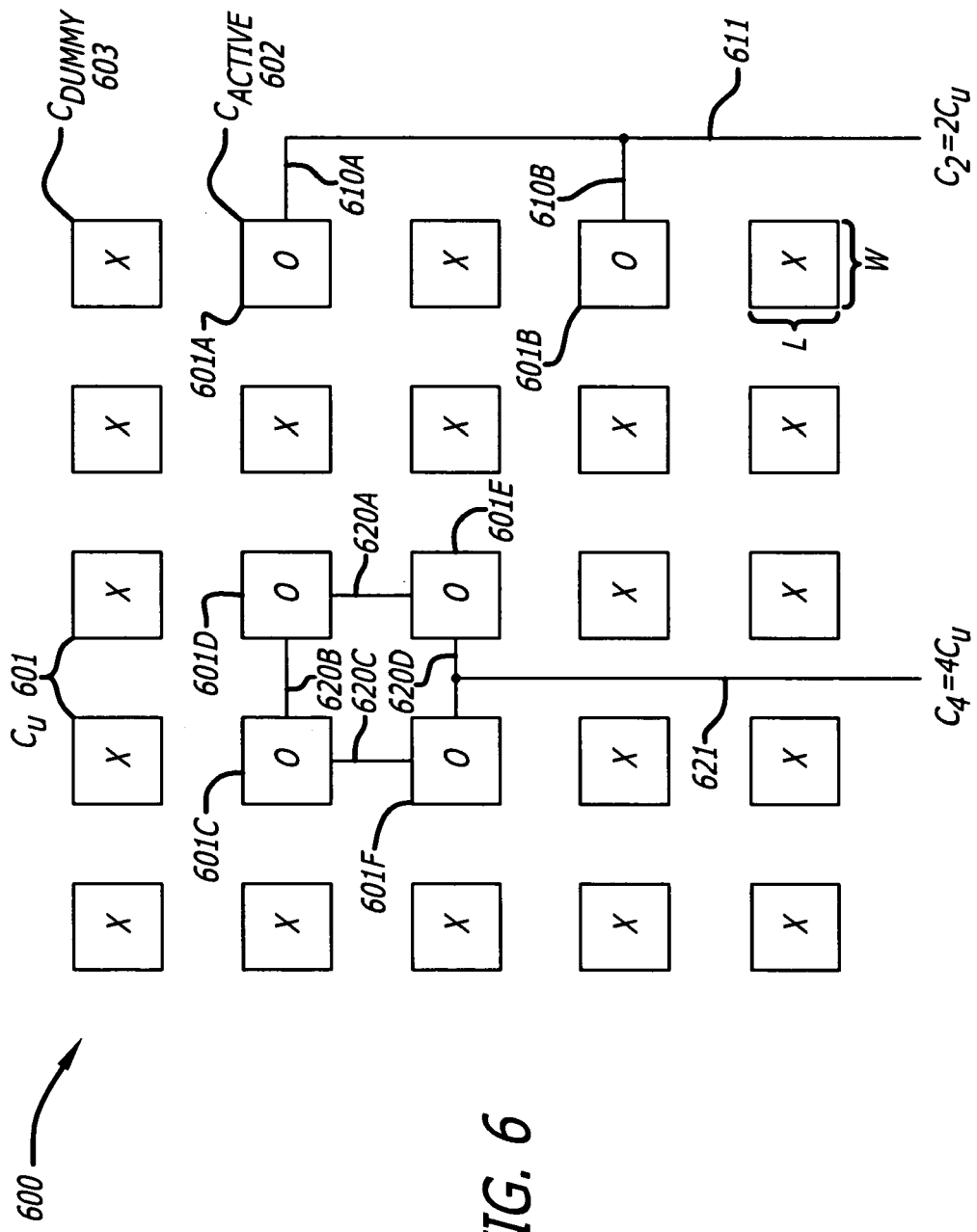
FIG. 6 is a top view of a portion of a layout of a capacitor array.

Referring now to FIG. 6, a capacitor array 600 of unit capacitor cells $C_u$ 601 is illustrated. In an integrated circuit 100, the capacitor array 600 is used to reduce the amount of manufacturing offset that would otherwise reduce the accuracy of each unit capacitor $C_u$ 601.

The unit capacitors $C_u$ 601 in the capacitor array 600 may be formed in rows and columns on a grid. Otherwise, the unit capacitors $C_u$ 601 in the capacitor array 600 may be formed using other geometric shapes in an off grid manner. FIG. 6 illustrates in a preferred embodiment, the top capacitor plate ($P_T$) of each unit capacitor cell CU 601 in the capacitor array 600. The top capacitor plates $P_T$ specifically have a matching bottom capacitor plate $P_B$ to the extent that they can be manufactured similarly. The bottom capacitor plate $P_B$ of each unit capacitor 601 is not illustrated in FIG. 6, as this is a top view of the capacitor array 600. Moreover, the illustration of the bottom capacitor plate $P_B$ in the capacitor array 600 is merely a mirror image of the top capacitor plate $P_T$, but for the interconnections made thereto and any manufacturing differences such as plate sizing (e.g., required minimum extensions of bottom plate edge beyond top plate edge). That is, different layers are used to form the bottom and the top capacitor plates so that they may differ somewhat due to process variations and offsets or a misalignment between the layers of the bottom plate $P_B$ and the top plate $P_T$. Furthermore, different interconnects may be made to the bottom plate $P_B$ and the top plate $P_T$ to cause a slight difference between them.

The capacitor array 600 includes active unit capacitor cells $C_{ACTIVE}$ 602 and dummy unit capacitor cells $C_{DUMMY}$ 603. These may also be referred to as active unit capacitors and dummy unit capacitors, respectively. The active unit capacitors 602 may be indicated in the illustrations by an "O" marked on their top capacitor plate ($P_T$) as illustrated in FIG. 6 for example. The dummy unit capacitors 603 may be indicated in the illustrations by an "X" marked on their top capacitor plate ($P_T$) as illustrated in FIG. 6 for example. The X and O illustrated in the Figures are just indicators and are not physically present on the capacitor plates of the unit capacitors 601.

Active capacitors 602 are selected or formed by providing an interconnect wire coupled thereto; such as interconnect wire 610 and 611 for example, to carry an analog signal. The interconnect wire may be a strip of a conductive material layer routed from one of the capacitor plates to another node or device on the integrated circuit 100. While FIG. 6 illustrates interconnecting the top plate $P_T$, the bottom plate $P_B$ may be similarly or alternatively interconnected instead. Typically, common nodes are joined together on the top plate $P_T$, while the routing of wires 611 and 621 is performed using the bottom plates $P_B$. Moreover, the bottom plates $P_B$ are preferably connected to ground or a voltage reference or supply to eliminate or reduce the impact of bottom plate parasitics. In the case of the charge scaling DAC 500 and the linear-array capacitor DAC 216', the bottom plates $P_B$ of the active capacitors are preferably coupled to the switches while the top plates $P_T$ of the active capacitors are coupled together with the common node 504 and the analog output $V_{AOUT}$. In FIG. 6, the wire traces 620A-620C are used to couple the top capacitor plates $P_T$ together of the unit capacitors 601C-601F. Wire route 621 is coupled to 620D to provide a capacitance value of $C_4$, which is equal to $4C_U$. The wire route 611 may provide a capacitance value of $C_2$, which is equal to $2C_U$. The wire routes 610A, 610B and 611 couple the top plates of the unit capacitors 601A and 601B together.

As discussed previously, the positioning of the active unit capacitors with respect to the dummy unit capacitors is important. Additionally, the spacing between active capacitors within a capacitor array is important. In this invention, as is discussed further below, the active unit capacitors are positioned with respect to the dummy unit capacitors in the capacitor array based on visual symmetry and electrical symmetry.

Figure 7A:
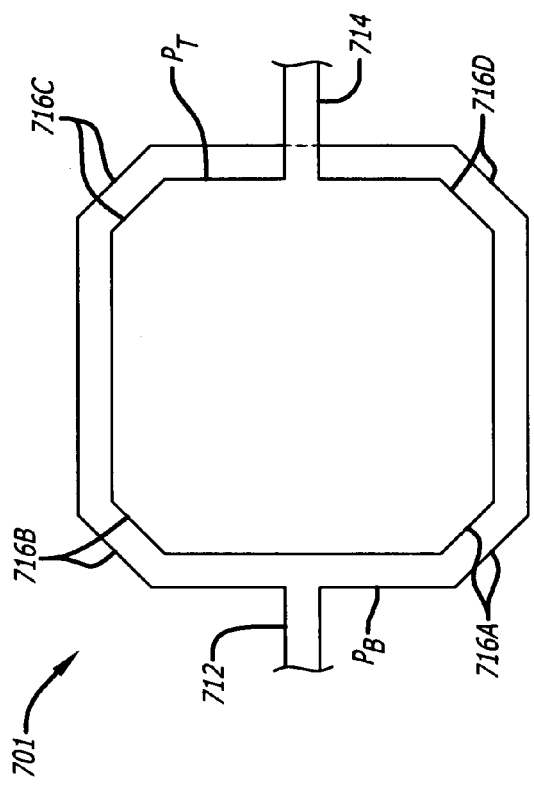
FIG. 7A is a top view of square shaped capacitor plates with chamfered corners that may be used for a unit capacitor $C_u$ of the capacitor array of FIG. 6.

Referring now to FIG. 7A, a top cutaway view of a unit capacitor Cu 701 is shown. The unit capacitor Cu 701 includes a bottom capacitor plate $P_B$ and a top capacitor plate $P_T$. The bottom capacitor plate $P_B$ may include an interconnect 712 extending from one side of the unit capacitor Cu 701. The top capacitor plate $P_T$ may include an interconnect 714 extending from another side of the unit capacitor Cu 701. The interconnects 712 and 714 may be used to make electrical connections to a given unit capacitor Cu 701.

Typical layout design rules for integrated circuit manufacturing processes of capacitor arrays may require that the bottom capacitor plate $P_B$ (but for the interconnect 714) extend beyond edges of the top capacitor plate $P_T$ due to misalignment and other tolerances as is illustrated in FIG. 7A.

The top and bottom capacitor plates of the unit capacitor may have various shapes such as a square shaped capacitor plate, a circular shaped capacitor plate, a triangular shaped capacitor plate, a hexagonal shaped capacitor plate, or a pentagonal shaped capacitor plate. Typically, the shape of the top capacitor plate $P_T$ and the bottom capacitor plate $P_B$ are the same for each of the plurality of unit capacitors Cu 701.

For capacitor matching considerations, a preferred shape of a unit capacitor Cu is one having oblique (i.e., not sharp) corners. This is because sharp corners are prone to non-uniform processing and thus a major source of mismatch in capacitors. However for area efficiency considerations, a square or rectangular shape allows denser unit capacitor Cu cell packing.

In addition, while a circular shape may be ideal for matching, it does not conform well to a practical implementation using a limited resolution grid. This may be due to the fact that drawn circles are not physically processed as circles but as multi-faceted polygons, or due to current layout tools being unable to implement circular shapes, instead requiring all drawn shapes to be polygons.

Due to such practical resolution-related limitations, a polygon shape is generally preferred for as the shape for the top and bottom capacitor plates (usually the plate shapes match). The shape for the top and bottom capacitor plates may be selected to provide a reasonable compromise between the issues of capacitor matching and area use efficiency.

One preferred embodiment for a unit capacitor shape is a square shaped plate with "chamfered" corners 716A-716D (referred to herein as a "chamfered square shape" capacitor plate) as is illustrated in the unit capacitor Cu 701 of FIG. 7A. The chamfering of the corners 716A-716D of the capacitor plates is sufficient enough to remove the sharp corners of the square shaped capacitor plates without forming an octagonal shape. However, an octagonal shaped capacitor plate is also an acceptable shape. The chamfered square shape is preferred over other polygonal shapes as it is a more area efficient compromise that retains the area efficiency of a square shape while gaining the oblique corners of an octagon shape for capacitor matching.

Figure 7B:
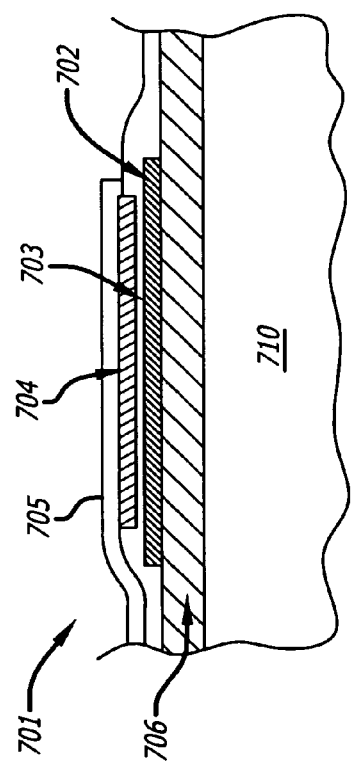
FIG. 7B is a cross-sectional side view of a unit capacitor of the capacitor array of FIG. 6.

Referring now to FIG. 7B, a cross sectional view of the exemplary unit capacitor $C_U$ 701 is illustrated. The unit capacitor $C_U$ 701 essentially consists of a first conductive layer 702, a dielectric layer 703, and a second conductive layer 704. The first conductive layer 702 forms the bottom capacitor plate $P_B$. The second conductive layer 704 forms the top capacitor plate $P_T$. The dielectric layer 703 keeps the capacitor plates spaced apart and isolated and may increase the capacitance of the capacitor over that of an air dielectric. The dielectric layer 703 may be an oxide layer or another type of insulating material used in semiconductor processing. The conductive layers 702 and 704 may be formed of the same material or different materials. One or both of the conductive layers 702 and 704 may formed out of a layer of metal, alloy, polysilicon, or other known conductive material layers commonly used in semiconductor processing. Insulating layers 705 and 706 may electrically isolate the unit capacitor $C_U$ 701 from other conductors as well as to prevent processing steps from damaging the conductive layers 702 and 704. Insulating layers 705 and/or 706 are illustrated as single contiguous layers but may also consist of a sandwich of several layers, including multiple insulating and conducting layers. The unit capacitor 701 is supported within the integrated circuit 100 on the substrate 710. Typically, the same material layer is utilized to interconnect each of the respective capacitor plates to other capacitor plates in the capacitor array 600. However, in a multi-layer metal integrated circuit, more than one layer of metal may be used to form interconnections with the capacitor plates.

Figure 7C:
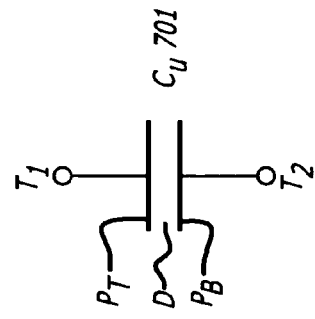
FIG. 7C is a schematic diagram of a unit capacitor $C_U$ corresponding to FIGS. 7A and 7B.

Referring now to FIG. 7C, a schematic diagram of the unit capacitor $C_U$ 701 is illustrated. Capacitor $C_U$ 701 has a first terminal $T_1$ and a second terminal $T_2$. The capacitor $C_U$ 701 includes the top plate $P_T$, the dielectric D, and the bottom plate $P_B$. As illustrated in FIG. 7C, the bottom plate $P_B$ couples to or may be considered as the second terminal $T_2$. The top plate $P_T$ couples to or may be considered as the first terminal $T_1$. The capacitance of the unit capacitor Cu generally depends upon the area of the plate, its length (L), width (W), plate thickness, and the type of dielectric material selected for the dielectric D and its thickness. The thickness of the dielectric establishes the amount of separation between capacitor plates as well as influences the capacitance.

To achieve a capacitance greater than the unit capacitance of the unit capacitor $C_U$, a plurality of unit capacitors 601 may be coupled together as illustrated in FIG. 6. As previously discussed, when capacitors are coupled in parallel, their capacitance values are added together to determined the equivalent capacitance.

As discussed previously, the unit capacitors Cu may be placed in a grid system in rows and columns. In this manner equal spacing is almost automatically maintained between each unit capacitor Cu in order to provide visual symmetry.

Referring now to FIG. 8, a schematic diagram of five unit capacitors 801A-801E is illustrated in one row or one column (i.e., a one dimensional capacitor array) to illustrate a cross sectional side view of a row or column in a capacitor array. FIG. 8 illustrates how active cells can generate unequal electric fields due to for example different far range fringing field environments. This results in different capacitances (i.e., mismatches) of the active unit capacitor cells in a capacitor array. Note that mismatches of near range fringing fields, such as from the bottom capacitor plate to the top plates or to interconnects, are primarily determined by the quality of visual symmetry because the near range fringing fields are a strong function of plate shape and thickness. Far range fringing fields, on the other hand, are a strong function of electric potentials of surrounding areas, particularly electrical potentials of surrounding conductive shapes. Thus, a source of mismatch in capacitance of capacitors may be due to differences in surrounding electric potentials. Therefore, once issues with visual symmetry in a capacitor array are resolved, issues of electrical symmetry become noticeable and should be considered. To provide optimal matching of capacitors in a capacitor array, both visual and electrical symmetry should be considered within the given integrated circuit design and manufacturing process.

In FIG. 8, three active unit capacitors are bordered by a dummy capacitor at each end. Capacitor 801A and 801E are dummy capacitors whose top plate $P_T$ and bottom plate $P_B$ are typically grounded (or otherwise set to a suitable voltage level). Unit capacitor 801B, 801C, and 801D are active capacitors having one terminal coupled together at node 801. Note that the top plates of the active unit cells 801B, 801C, and 801D are connected together while the bottom plates are not. This connection of the top plates is typical of the capacitor array 233 found in the DAC block 216' in stages of a pipeline A/D converter.

In the layout of the capacitor array, a long-range fringe capacitance $C_f$ is formed between the top plate of one capacitor and the bottom plate of its neighboring capacitor. As discussed previously, mismatch of the near range fringe fields are related to visual matching and may be ignored in the computations of the long-range fringe capacitance $C_f$. In FIG. 8, fringe capacitors 802A-802H are illustrated between the terminals of the unit capacitor 801A-801E. As a result of a parasitic fringe capacitor, the effective capacitance provided by an active unit capacitor may differ from those around it. The effective capacitance of active capacitor 801B is $C_1$. The effective capacitance of the unit capacitor 801C is $C_2$. The effective capacitance of unit capacitor 801D is $C_3$. The effective capacitance $C_2$ differs from the effective capacitances of $C_1$ and $C_3$. The effective capacitance $C_2$ equals $C+C_f+C_f$. The effective capacitance $C_1=C_3$ which equals $C+C_f$. While this configuration of active and dummy capacitors may provide visual symmetry, it does not provide electrical symmetry and results in the effective capacitance of the active unit capacitor 801C differing from that of effective capacitance of capacitors 801B and 801D.

The methods of this invention describe the arrangements of active cells and dummy cells in a capacitor array to provide visual and electrical symmetry. This invention discloses the possible ways to arrange any number of N active unit capacitor cells together with dummy unit capacitor cells to theoretically achieve visual and electrical matching. Capacitor layout methods are described herein in how active unit capacitor cells should be selected and arranged amongst dummy unit capacitor cells so that the far range fringing fields are symmetric from the point of view of each active unit capacitor cell.

There are four rules, Rules 1-4, to follow in order to arrange any number of N active unit capacitor cells together with dummy unit capacitor cells in a capacitor array to provide both visual and electrical symmetry. Which rules are followed depends upon the number N of the N active unit capacitor cells, which form the active capacitor array. The four rules are exemplified by FIGS. 9A-15 in which "X" refers to a dummy unit capacitor cell and "O" to an active unit capacitor cell.

The four rules are as follows:

Rule 1

If N active unit cells are placed at symmetric locations of an N-equilateral shape, they will automatically have the same electrical neighborhood relative to neighboring active unit cells. Dummy unit capacitor cells are filled in around the N active unit cells at the symmetric locations of the N-equilateral shape to maintain equivalent visual surroundings. FIGS. 9A-10B illustrate examples of Rule 1.

FIGS. 9A and 10A illustrate symbolic diagrams of the arrangement of active cells and dummy cells in a capacitor array to provide visual and electrical symmetry in this case. FIGS. 9B and 10B illustrate a top view of the layout of capacitor plates and the interconnect of the unit capacitor cells in accordance with FIGS. 9A and 10A respectively.

Referring to FIGS. 9A-9B, two active unit capacitor cells (i.e., N=2) 902A-902B are placed adjacent to each other to achieve symmetric bi-equilateral shape. The dummy unit capacitor cells (indicated by the "X") are filled in around them to maintain equivalent visual surroundings for all unit capacitor cells. The two active unit capacitor cells 902A-902B may be interconnected together by the interconnect 910.

Referring to FIGS. 10A-10B, four active unit capacitor cells (i.e., N=4) 1002A-1002D may be placed at the corners of a square, a quad-equilateral shape. The dummy unit capacitor cells are filled in around them to maintain equivalent visual surroundings for all unit capacitor cells. The active unit capacitor cells 1002A-1002D may be interconnected together by the interconnect 1010A-1010D.

In the case of five active unit capacitor cells (i.e., N=5), the five active unit capacitor cells may be placed at the corners of an equilateral pentagon as illustrated in FIG. 15 with b=a. Dummy cells are then used to fill in and to maintain equivalent visual surroundings for all unit capacitor cells.

Rule 2

If N is a prime number, the arrangement that will provide both visual and electrical symmetry is an arrangement of N active unit cells at the symmetric locations of the N-equilateral shape (i.e., N-sided shape) as described by Rule 1.

Under this rule 2, if N is not a prime number (i.e., it is divisible), the number N active unit capacitor cells can be divided to form smaller sets of active unit capacitor cells coupled together which are less than N. Each of these smaller sets is to be arranged according Rule 1 or further subdivided according to Rule 2.

FIGS. 11A-12B illustrate examples of Rule 2. FIGS. 11A and 12A illustrate symbolic diagrams of arrangements of active cells and dummy cells in a capacitor array to provide visual and electrical symmetry. FIGS. 11B and 12B illustrate top views of the layout of capacitor plates and the interconnect of the unit capacitor cells in accordance with FIGS. 11A and 12A, respectively.

Referring to FIGS. 11A-11B where the desired capacitance has six active unit capacitors (i.e., N=6), the set of six active unit capacitors 1102A-1102F can be subdivided into three sets of two active unit capacitors, for example. Active unit capacitors 1102A-1102B are a first subdivided set 1104A. Active unit capacitors 1102A-1102B are a second subdivided set 1104B. Active unit capacitors 1102E-1102F are a third subdivided set 1104C. The sets 1104A-1104C are separated from each other by rows 1106A-1106B of dummy unit capacitors in accordance with Rule 3, which is discussed further below. The active unit capacitor cells 1102A-1102F may be interconnected together by the interconnect 1110A-1110D as shown and illustrated in FIG. 11B.

Alternatively, the set of six active unit capacitors can be subdivided into two sets of three active unit capacitors (not shown), for example.

Referring to FIGS. 12A-12B where the desired capacitance has eight active unit capacitors (i.e., N=8), the set of eight active unit capacitors 1202A-1202H can be subdivided into two sets of four active unit capacitors, for example.

Active unit capacitors 1202A-1202D are a first subdivided set 1204A. Active unit capacitors 1202E-1202H are a second subdivided set 1204B. The sets 1204A-1204B are separated from each other a row 1206 of dummy unit capacitors in accordance with Rule 3, which is discussed further below. The active unit capacitor cells 1202A-1202H may be interconnected together by the interconnect 1210A-1210I as shown and illustrated in FIG. 12B.

Alternatively, the set of eight active unit capacitors can be subdivided into four sets of two active unit capacitors (not shown), for example.

Rule 3

Under Rule 3, the immediate neighborhood of a unit capacitor cell is defined to be its nearest neighbors only. That is, we explicitly assume that the electrical neighborhood of a unit capacitor cell is contained in its immediate neighborhood and does not extend beyond. Thus under Rule 3, the subdivisions performed in Rule 2 are made such that the active cells in the smaller sets do not encroach into each other's immediate neighborhood.

FIGS. 13A-14B illustrate examples of Rule 3. FIGS. 13A and 14A illustrate symbolic diagrams of arrangements of active cells and dummy cells in a capacitor array. FIGS. 13B and 14B illustrate top views of the layout of capacitor plates of the unit capacitor cells in accordance with FIGS. 13A and 14A, respectively.

Assume for example that the desired capacitance has eight active unit capacitors (i.e., N=8); the set of eight active unit capacitors is subdivided into four sets of two active unit capacitors. Under Rule 3, the arrangement of the four sets of two active unit capacitors is made such that the active cells in the smaller sets do not encroach into each other's immediate neighborhood. In other words, the active cells in a given subdivided set is spaced apart from the active cells in another subdivided set by a distance of at least one dummy unit capacitor.

In FIGS. 13A-13B, a set of eight active unit capacitors 1302A-1302H are arranged into four subdivided sets 1304A-1304D of two active unit capacitors. Active unit capacitors 1302A-1302B are a first subdivided set 1304A. Active unit capacitors 1302C-1302D are a second subdivided set 1304B. Active unit capacitors 1302E-1302F are a third subdivided set 1304C. Active unit capacitors 1302G-1302H are a fourth subdivided set 1304D. A row 1306 of dummy unit capacitor cells separates the subdivided sets 1304A-1304B from the subdivided sets 1403C-1304D. A column 1308 of dummy unit capacitor cells separates the subdivided sets 1304A and 1304C from the subdivided sets 1403B and 1304D. Thus, the active cells in each of the subdivided sets are separate from the active cells in another subdivided set by a distance of at least one dummy unit capacitor. Rule 3 is properly followed in this case and there is no encroachment from one set of active unit capacitor cells to another. The active unit capacitor cells 1302A-1302H may be interconnected together by the interconnect 1310A-1310G as shown and illustrated in FIG. 13B.

In FIGS. 14A-14B, an arrangement of a set of eight active unit capacitors 1402A-1402H into four sets 14014A-1404D of two active unit capacitors is not properly made and there is encroachment from one set to another. Active unit capacitors 1402A-1402B are a first subdivided set 1404A. Active unit capacitors 1402C-1402D are a second subdivided set 1404B. Active unit capacitors 1402E-1402F are a third subdivided set 1404C. Active unit capacitors 1402G-1402H are a fourth subdivided set 1404D.

A row 1406 of dummy capacitors separates subsets 1404A and 1404B from subsets 1404C and 1404D. However there is no column of dummy capacitors separating the subsets as there was in FIGS. 13A-13B. As illustrated in FIG. 14B, the subset 1404A of two active unit capacitors 1402A-1402B is not spaced apart by a dummy unit capacitor (i.e., an X) from the subset 1404B of two active unit capacitors 1402C-1402D. The subset 1404A encroaches on the subset 1404B and visa-versa. Similarly, the subset 1404C encroaches on the subset 1404D and visa-versa. Thus, FIGS. 14A-14B do not follow Rule 3 hereof.

Rule 4

Due to visual symmetry requirements, active cells and dummy cells are often placed on a grid to form aligned rows and columns. This results in symmetric array layouts for many N-equilateral shapes (such as a square), which is very precise. That is, the layout distances between all active cells and dummy cells are equal. However, due to grid resolution limits, in the case of some N-equilateral shapes (such as a pentagon), the active cells and dummy cells may be arranged at slightly asymmetric (unequal) distances from each other in the layout, resulting in a slightly skewed N-equilateral shape. This is done to both preserve array area and to keep unit cells (active and dummy) at reasonably short distances from each other. Thus, the active cells are not aligned in absolutely precise rows and columns in order to form the ideal N-equilateral shape under Rule 1. This should not be viewed as a departure from Rules 1-3 but instead as a practical limit of reasonable grid resolution and practicality in layout.

Under Rule 4, sufficient separation distance between active cells is maintained, even when active cells and dummy cells are arranged off grid in accordance with complying with Rule 1. FIG. 15 illustrates Rule 4.

Referring to FIG. 15, five active unit capacitor cells 1502A-1502E (i.e., N=5) are placed at the corners of an equilateral pentagon. In one embodiment, the spacing is equivalent with spacing "b" equal to spacing "a" between active unit capacitor cells to form an equilateral pentagon. In another embodiment, the spacing is slightly non-equivalent so that spacing "b" is not equal to the spacing "a" and a non-equilateral pentagon (i.e., an N-shaped polygon for an N-sided shape) is formed. That is, while spacing "b" is not exactly equal to the spacing "a" it may be substantially equal. This exception to the N-equilateral shape described by Rule 1 may be due to lithographic limitations during manufacturing, a desire to create a more compact layout of the capacitor array, or some other reason, for example. In any case, dummy unit capacitor cells are then used to fill in and to maintain equivalent visual surroundings for all unit capacitor cells.

By applying these rules in arranging (i.e., laying out) the active and dummy unit capacitor cells in a capacitor array, better matching of unit capacitor cells may be achieved. When utilized for precision capacitor arrays in an analog to digital converter, such as A/D converter 200, the better matching of unit capacitor cells may provide the following improvements: elimination or reduction of calibration requirements; elimination or reduction of circuit techniques (e.g., dynamic methods) used to provide unit capacitor cell matching; improved linearity (both Differential Non-Linearity or DNL and Integral Non-Linearity or INL specifications are improved); and lower power dissipation where every factor of two improvement in matching accuracy may lower power consumption by up to four times for a given circuit block.

These rules may be performed manually or by automatic means such as through the use of a computer aided design software program. In which case when implemented in software, the elements of the present invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

The preferred embodiments of the invention for are thus described. While the invention has been described in particular embodiments, the invention should not be construed as limited by such embodiments, but rather construed according to the claims that follow below.

What is claimed is:

1. A capacitor array in an integrated circuit, the capacitor array comprising:

a plurality of unit capacitor cells arranged to provide visual symmetry;

a set of N active unit capacitor cells of the plurality of unit capacitor cells having a terminal coupled to a signal path to carry analog signals;

if N is a prime number, the N active unit capacitor cells being arranged to be symmetrically located to form an N-equilateral two-dimensional shape to provide electrical symmetry, otherwise if N is not a prime number, the set of N active unit capacitor cells being divided into P subsets of M active unit capacitor cells, the M active unit capacitor cells of each of the P subsets being arranged to be symmetrically located to form an M-equilateral two-dimensional shape in a neighborhood, and each neighborhood of each M-equilateral two-dimensional shape being separated by one or more dummy unit capacitor cells to avoid encroachment of one neighborhood into another in order to provide electrical symmetry.

2. The capacitor array of claim 1 wherein, the plurality of unit capacitor cells are arranged in equally spaced apart rows and columns to provide visual symmetry.

3. The capacitor array of claim 1 wherein, the N-equilateral shape is slightly skewed, and a predetermined distance of separation is maintained between active cells.

4. The capacitor array of claim 1 wherein, the unit capacitor cells are integrated circuit capacitors.

5. The capacitor array of claim 4 wherein, the integrated circuit capacitors are metal oxide semiconductor capacitors.

6. The capacitor array of claim 4 wherein, the integrated circuit capacitors are thin film capacitors.

* * * * *